(12) United States Patent
Zhuang et al.

(10) Patent No.: US 7,078,157 B2
(45) Date of Patent: Jul. 18, 2006

(54) PHOTOSENSITIVE COMPOSITION AND USE THEREOF

(75) Inventors: Hong Zhuang, Raritan, NJ (US); Joseph E. Oberlander, Phillipsburg, NJ (US); Ping-Hung Lu, Bridgewater, NJ (US); Stanely F. Wanat, Scotch Plains, NJ (US); Robert R. Plass, Hackensack, NJ (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 185 days.

(21) Appl. No.: 10/376,356

(22) Filed: Feb. 27, 2003

(65) Prior Publication Data

US 2004/0175653 A1    Sep. 9, 2004

(51) Int. Cl.
| | | |
|---|---|---|
| G03C 1/73 | (2006.01) | |
| G03F 7/028 | (2006.01) | |
| G03F 7/20 | (2006.01) | |
| G03F 7/30 | (2006.01) | |
| G03F 7/42 | (2006.01) | |

(52) U.S. Cl. .............................. 430/281.1; 430/286.1; 430/287.1; 430/285.1; 430/325; 430/315; 430/329; 430/331; 430/916

(58) Field of Classification Search ............. 430/287.1, 430/281.1, 285.1, 286.1, 916, 325, 315, 329, 430/331
See application file for complete search history.

(56) References Cited

U.S. PATENT DOCUMENTS

| | | | |
|---|---|---|---|
| 3,554,987 A | 1/1971 | Smith et al. ................. 526/240 |
| 3,825,430 A | 7/1974 | Kurka ..................... 430/287.1 |
| 4,722,947 A | 2/1988 | Thanawalla ................. 522/120 |
| 4,745,138 A | 5/1988 | Thanawalla et al. ......... 522/120 |
| 4,820,773 A | 4/1989 | Alexander et al. .......... 525/274 |
| 5,137,952 A | 8/1992 | Miller et al. ................ 524/140 |
| 5,264,475 A | 11/1993 | Kissel ....................... 524/211 |
| 5,707,781 A * | 1/1998 | Wilczak ................... 430/281.1 |
| 6,074,436 A | 6/2000 | Wang et al. ............... 8/115.62 |
| 6,750,002 B1 * | 6/2004 | Novak et al. ............... 430/570 |

FOREIGN PATENT DOCUMENTS

| | | |
|---|---|---|
| EP | 0 366 333 | 5/1990 |
| EP | 0 366 333 A2 | 5/1990 |
| EP | 0 366 333 A3 | 5/1990 |
| EP | 0 539 606 | 5/1993 |
| EP | 0 740 208 | 10/1996 |
| EP | 0 740 208 A1 | 10/1996 |
| WO | WO 95/24674 | 9/1995 |

OTHER PUBLICATIONS

Invitation to Pay Additional Fees (Form PCT/ISA/206).
Product Bulletin: SMA® 1440 Flake, "Styrene Maleic Anhydride Copolyer".
Product Bulletin: SMA® 17352, "Styrene Maleic Anhydride Copolymer".
Product Bulletin. Sartomer. "Acrylated Amine Coinitiators".
Product Bulletin. Sarbox® Specialty Oligomers. Sartomer.
Form PCT/ISA/220 for PCT/EP2004/001348.
International Search Report (Form PCT/ISA/210) for PCT/EP2004/001348.
Written Opinion (Form PCT/ISA/237) for PCT/EP2004/001348.

* cited by examiner

*Primary Examiner*—Sin Lee
(74) *Attorney, Agent, or Firm*—Alan P. Kass

(57) ABSTRACT

A composition that comprises a photopolymerizable compound containing at least two pendant unsaturated groups; at least one ethylenically unsaturated photopolymerizable polyalkylene oxide hydrophilic monomer; at least one non-ionic surfactant; and at least one photoinitiator is provided. The composition also preferably contains at least one amine modified acrylic oligomer and a dye. Other conventional photoresist components such as photosensitizers, adhesion promoters, leveling agents and solvents may also be included in the composition. Such compositions are useful for forming a pattern on a substrate, such as patterning microlithographic circuits on a substrate.

23 Claims, No Drawings

PHOTOSENSITIVE COMPOSITION AND USE THEREOF

TECHNICAL FIELD

The present invention related to improving the developing characteristics of certain photoresist polymer compositions without sacrificing their resolution properties. The present invention is of particular importance in achieving high aspect ratio patterning which does not leave photoresist residue or scum in patterned areas.

BACKGROUND OF THE INVENTION

In the manufacture of patterned structures, such as wafer level packaging, electrochemical deposition of electrical interconnects has been used as the density of the interconnects increase. For example, see Solomon, Electrochemically Deposited Solder Bumps for Wafer-Level Packaging, Packaging/Assembly, Solid State Technology, pages 84–88, April 2001; disclosure of which is incorporated herein by reference. Wafer level packaging produces a chip/die/device that is ready for direct assembly onto the final substrate or final system platform. Wafer-level packaging is used for making electrical connections to an integrated circuit chip above the active circuitry and is especially important as the density of inputs and outputs (I/Os) on chips increases.

Wafer-level packaging schemes use a technique known as redistribution to connect the peripheral pads to an area array of solder bumps on the surface of the wafer. The basic sequence of wafer-level packaging with redistribution involves creating a level of interconnect that defines an under-bump pad that is connected to the peripheral bonding pad. The under-bump pad is exposed by a via in a dielectric layer. Then the entire wafer receives an under-bump metallurgy (UBM) stack that provides an electroplating seed layer on top of a diffusion barrier and adhesion layer. The plating mask is formed in photoresist that can range from about 1 μm to over 200 μm thick, but are typically 25–125 μm thick. Layers exceeding about 100 μm to about 125 μm are typically applied in double coats. The solder bump is electroplated within the via in the case when a thicker photoresist is used. The solder bump is typically electroplated above the photoresist when it is <50 μm thick (overplating or mushroom plating). The photoresist is then stripped and the UBM is etched away everywhere it is not covered by the solder bumps. Finally, the bumps are reflowed, causing them to reform in the shape of truncated spheres.

Gold bumps, copper posts and copper wires for redistribution in wafer level packaging require a resist mold that is later electroplated to form the final metal structures in advanced interconnect technologies. The resist layers are very thick compared to the photoresists used in the IC manufacturing. Both feature size and resist thickness are typically in the range of 5 μm to 100 μm, so that high aspect ratios (resist thickness to line size) have to be patterned in the photoresist.

Photoresists of the present invention also have use in flat panel displays when added pigments are added to the compositions herein.

Concerning the photoresist, photopolymerizable compositions for imaging have long been known in the art. For instance, U.S. Pat. No. 2,760,863 suggested using photopolymerizable compositions in the preparation of printing plates. More recently, similar compositions have been suggested for color proofing systems for the print industry. Since then, a variety of such photopolymerizable compositions have been described and the use of photopolymerizable compositions are now used in microlithography.

The pattern is formed by imagewise exposing the resist material to irradiation by lithographic techniques. The irradiation employed is usually X-ray, UV radiation, electron beam radiation or ion-beam radiation.

The compositions of the present invention are negative-working photoresist compositions. Negative-working photoresist compositions are exposed imagewise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating, thereby uncovering a desired portion of the underlying substrate surface on which the photoresist composition was deposited.

Aqueous developable photopolymerizable compositions are of especial interest for negative working photoresist compositions. The polymeric binders for such compositions can contain acidic functionality so that the binder polymer is soluble in alkaline aqueous solution and thereby renders the photopolymerizable composition developable in alkaline aqueous solutions.

In the literature, carboxylic acid functionalized acrylic polymers are used as the binder polymers. To ensure the physical performances of the imaged patterns, high molecular weight polymers were utilized which may render slower development rates.

The photopolymerizable compound(s) are typically ethylenically unsaturated monomers and/or short chain oligomers which will crosslink by photo-induced free radical polymerization and form desired insoluble patterns.

However, it has been observed that photopolymerizable formulations which exhibit acceptable development rates suffer from the presence of photoresist residue or scum after development into imaged or patterned areas and/or reduced image resolution, especially when the pattern is relatively thick (e.g., greater than 50 μm).

SUMMARY OF THE INVENTION

The present invention provides compositions that are useful in negative acting resists and that are sensitive to imaging radiation. The compositions of the present invention typically exhibit good resolution along with enhanced clean development without sacrificing development speed to an undesired extent.

The present invention is related to a composition which comprises a) a photopolymerizable compound containing at least two pendant unsaturated groups; b) at least one ethylenically unsaturated photopolymerizable hydrophilic polyalkylene oxide monomer; c) at least one nonionic surfactant; and d) at least one photoinitiator.

Preferred compositions according to the present invention can also include one or more components selected from at least one amine modified acrylic oligomer, dyes, adhesion promoters, leveling agents, photosensitizers, solvents and the like.

The present invention is also related to a process for forming a pattern of photoresist. The process comprises:
1) providing on a substrate a layer of a photoresist composition comprising a) a photopolymerizable compound containing at least two pendant unsaturated groups; b) at least one ethylenically unsaturated photopolymerizable polyalkylene oxide hydrophilic monomer; c) at least one nonionic surfactant; and d) at least one photoinitiator;

2) imagewise exposing the layer to actinic radiation in a pattern to thereby cause a change in the solubility of the photoresist where exposed; and 3) developing the photoresist to thereby form the pattern.

A further aspect of the present invention relates to forming a pattern on a substrate. The process comprises:

1) providing on a substrate a layer of a resist composition which comprises: a) a photopolymerizable compound containing at least two pendant unsaturated groups; b) at least one ethylenically unsaturated photopolymerizable polyalkylene oxide hydrophilic monomer; c) at least one nonionic surfactant; and d) at least one photoinitiator 2) imagewise exposing the layer of resist composition to irradiation;

3) developing the resist to form the desired pattern of vias;

4) depositing electrically conductive material in the vias to form a desired pattern of electrical interconnections; and 5) removing the resist.

In the above processes, a) can preferably be a compound as described below and b) can be selected from the ethylenically unsaturated photopolymerizable polyalkylene oxide hydrophilic monomers described below.

In the present invention, a) is preferably a compound selected from the group consisting of (i) a compound having the formula

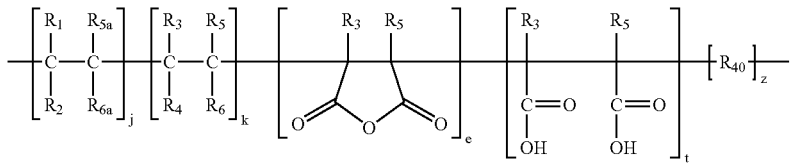

wherein $R_1$ and $R_2$ may be the same or different and each may independently be selected from the group consisting of hydrogen, $C_{1-50}$ alkyl, $C_{6-20}$ aryl, $C_{1-20}$ alkaryl, $C_{1-20}$ aralkyl, $C_{1-10}$ alkoxy, $C_{3-18}$ cycloalkyl, $C_{2-20}$ alkenyl, 2,3-epoxy propyl, cyano, and halogen, the $C_{1-50}$ alkyl, $C_{6-20}$ aryl, $C_{1-20}$ alkaryl, $C_{1-20}$ aralkyl, $C_{1-10}$ alkoxy, $C_{3-18}$ cycloalkyl, and $C_{2-20}$ alkenyl being unsubstituted or substituted by one or more $C_{3-12}$ cycloalkyl, cyano, $C_{1-5}$ alkyl, $C_{1-6}$ alkoxy, $C_{6-20}$ aryloxy, $C_{1-20}$ aralkyloxy, 2,3-epoxy propyl, hydroxyl, or halogen groups;

$R_3$ is selected from the group consisting of hydrogen, $C_{1-50}$ alkyl, $C_{6-20}$ aryl, $C_{1-20}$ alkaryl, $C_{1-20}$ aralkyl, $C_{3-18}$ cycloalkyl, $C_{2-20}$ alkenyl, cyano, 2,3-epoxy propyl, and halogen, the $C_{1-50}$ alkyl, $C_{6-20}$ aryl, $C_{1-20}$ alkaryl, $C_{1-20}$ aralkyl, $C_{3-18}$ cycloalkyl, and $C_{2-20}$ alkenyl being unsubstituted or substituted by one or more $C_{3-12}$ cycloalkyl, cyano, $C_{1-5}$ alkyl, $C_{1-6}$ alkoxy, $C_{6-20}$ aryloxy, $C_{1-20}$ aralkyloxy, 2,3-epoxy propyl, hydroxyl, or halogen groups;

$R_4$, $R_6$, and $R_{6a}$ may be the same or different and each may independently be selected from the group consisting of hydrogen, cyano, $C_{1-50}$ alkyl, $C_{6-20}$ aryl, $C_{1-20}$ alkaryl, $C_{1-20}$ aralkyl, $C_{3-18}$ cycloalkyl, $C_{2-20}$ alkenyl, halogen, an oxyalkylated group containing from 2 to 4 carbon atoms in each oxyalkylated group, which group may be of 1 to 20 repeating units and which terminates with hydrogen or $C_{1-4}$ alkyl, X, and $-(CH_2)_n-C(=O)-OR_7$, where $R_7$ is selected from hydrogen, $C_{1-50}$ alkyl, $C_{6-20}$ aryl, $C_{1-20}$ alkaryl, $C_{1-20}$ aralkyl, $C_{2-20}$ alkenyl, $C_{5-50}$ carbocyclic ring, $NR_{7a}R_{7b}$, 2,3-epoxy propyl, n is a whole number from 0 to 3, the $C_{1-50}$ alkyl, $C_{6-20}$ aryl, $C_{1-20}$ alkaryl, $C_{1-20}$ aralkyl, $C_{3-18}$ cycloalkyl, $C_{2-20}$ alkenyl, and $C_{5-50}$ carbocyclic ring being unsubstituted or substituted by one or more $C_{3-12}$ cycloalkyl, cyano, $C_{1-5}$ alkyl, $C_{1-6}$ alkyoxy, $C_{6-20}$ aryloxy, $C_{1-20}$ aralkyloxy, 2,3-epoxy propyl, hydroxyl, or halogen groups, each of $R_{7a}$ and $R_{7b}$ are independently hydrogen or $C_{1-20}$ alkyl and X is $-C(=O)-R_{10}$ or $-R_{60}-C(=O)-CH_2-R_{70}$ where $R_{10}$ is selected from the group consisting of $-O-R_{11}-O-C(=O)-C(R_{12})=CH_2$, $-O-R_{11}-NH-O-C(=O)-C(R_{12})=CH_2$, and $-NH-R_{11}-O-C(=O)-C(R_{12})=CH_2$, where $R_{11}$ is a linear or branched divalent $C_{1-40}$ alkylene or an oxyalkylated derivative thereof containing from 2 to 4 carbon atoms in each oxyalkylated group, which group may be of 1 to 20 repeating units; $R_{60}$ is $-C(=O)-W-R_{11}-V-$; each of W and V are independently selected from O, S or $NR_{100}$ where $R_{100}$ is hydrogen or $C_{1-6}$ alkyl; $R_{11}$ is as above, $R_{70}$ is $-C(=O)-R_{50}$ or -cyano, where $R_{50}$ is hydrogen or $C_{1-10}$ alkyl;

$R_{12}$ is hydrogen or $C_{1-5}$ alkyl;

$R_5$ and $R_{5a}$ may be the same or different and each may be independently selected from the group consisting of hydrogen, $C_{1-50}$ alkyl, $C_{6-20}$ aryl, $C_{1-20}$ alkaryl, $C_{1-20}$ aralkyl, $C_{3-18}$ cycloalkyl, $C_{2-20}$ alkenyl, cyano, 2,3-epoxy propyl, halogen and carboxy, the $C_{1-50}$ alkyl, $C_{6-20}$ aryl, $C_{1-18}$ alkaryl, $C_{1-20}$ aralkyl, $C_{2-20}$ alkenyl, and $C_{3-12}$ cycloalkyl being unsubstituted or substituted by one or more $C_{3-12}$ cycloalkyl, cyano, $C_{1-5}$ alkyl, $C_{1-6}$ alkoxy, $C_{6-20}$ aryloxy, $C_{1-20}$ aralkyloxy, 2,3-epoxy propyl, hydroxyl, or halogen groups; and $R_{40}$ is any monomer that is copolymerizable with moieties found in $[\ ]_j$, $[\ ]_k$, $[\ ]_e$, and/or $[\ ]_t$, including those moieties identified for $[\ ]_j$, $[\ ]_k$, $[\ ]_e$, and/or $[\ ]_t$; and j, k, e, t, and z are each whole numbers such that the sum of j, k, e, t, and z ranges from about 2 to about 20, with j and k each being equal to or greater than 1, and z, e and/or t may be zero;

(ii) a compound having the formula

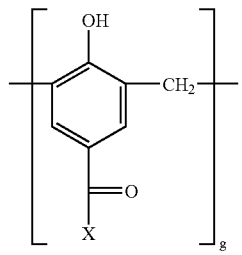

where g is an integer of 3 to 10 and X is as described above; and (iii) a compound having the formula

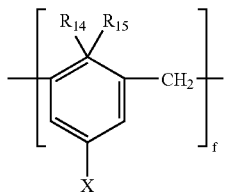

where f is an integer of 3 to 10; $R_{14}$ and $R_{15}$ may be the same or different and each may independently be selected from the group consisting of hydrogen and $C_{1-20}$ alkyl, the $C_{1-20}$ alkyl being unsubstituted or substituted by one or more $C_{3-12}$ cycloalkyl, cyano, $C_{1-5}$ alkyl, or halogen groups; and X is as described above More preferably, a) is compound (i) having the formula

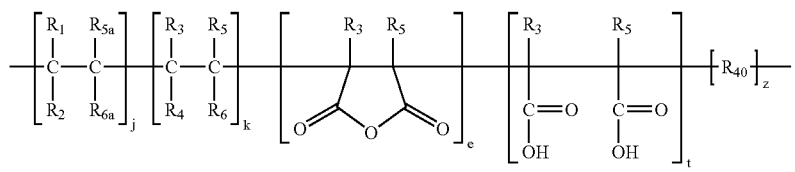

wherein either $R_1$ is hydrogen and $R_2$ is $C_{6\text{-}10\ 20}$ aryl unsubstituted or substituted by one or more $C_{3-12}$ cycloalkyl, $C_{1-6}$ alkoxy, 2,3-epoxy propyl, hydroxyl, cyano, $C_{1-5}$ alkyl, or halogen groups; $R_{5a}$ is hydrogen; $R_{6a}$ is hydrogen; $R_3$ is hydrogen; $R_4$ in is —$(CH_2)_n$—C(=O)—OR$_7$, where $R_7$ is hydrogen, and n is 0; $R_5$ is hydrogen; $R_6$ in is X where X is —C(=O)—$R_{10}$ where $R_{10}$ is —O—$R_{11}$—O—C(=O)—C($R_{12}$)=CH$_2$, $R_{11}$ is a $C_2$ alkylene, $R_{12}$ is hydrogen; e and t are each not zero, and z is zero; or $R_1$ is hydrogen and $R_2$ is $C_{6\text{-}10\ 20}$ aryl unsubstituted or substituted by one or more $C_{3-12}$ cycloalkyl, $C_{1-6}$ alkoxy, 2,3-epoxy propyl, hydroxyl, cyano, $C_{1-5}$ alkyl, or halogen groups; $R_{5a}$ is hydrogen; $R_{6a}$ is hydrogen; $R_3$ is hydrogen; $R_4$ in is —$(CH_2)_n$—C(=O)—OR$_7$, where $R_7$ is hydrogen, and n is 0; $R_5$ is hydrogen; $R_6$ in is X where X is —C(=O)—$R_{10}$ where $R_{10}$ is —O—$R_{11}$—O—C(=O)—C($R_{12}$)=CH$_2$, $R_{11}$ is a $C_2$ alkylene, $R_{12}$ is hydrogen; each of e, t and z are not zero; and $R_{40}$ is

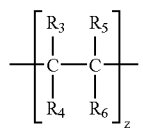

where $R_3$ in [ ]$_z$ and $R_5$ in [ ]$_z$ are hydrogen, $R_4$ in [ ]$_z$ is —$(CH_2)_n$—C(=O)—OR$_7$, where $R_7$ is hydrogen, n is 0; $R_6$ in [ ]$_z$ is —$(CH_2)_n$—C(=O)—OR$_7$, where $R_7$ is $C_{1-50}$ alkyl substituted by $C_{1-6}$ alkoxy, and n is 0; or $R_1$ is hydrogen and $R_2$ is $C_{6\text{-}10\ 20}$ aryl unsubstituted or substituted by one or more $C_{3-12}$ cycloalkyl, $C_{1-6}$ alkoxy, 2,3-epoxy propyl, hydroxyl, cyano, $C_{1-5}$ alkyl, or halogen groups; $R_{5a}$ is hydrogen; $R_{6a}$ is hydrogen; $R_3$ is hydrogen; $R_4$ in is —$(CH_2)_n$—C(=O)—OR$_7$, where $R_7$ is hydrogen, and n is 0; $R_5$ is hydrogen; $R_6$ in is X where X is —C(=O)—$R_{10}$ where $R_{10}$ is —O—$R_{11}$—O—C(=O)—C($R_{12}$)=CH$_2$, $R_{11}$ is a $C_2$ alkylene, $R_{12}$ is hydrogen; and each of e, t and z are each zero.

The ethylenically unsaturated photopolymerizable polyalkylene oxide hydrophilic monomer (b)) is preferably selected from the group consisting of diethylene glycol diacrylate, triethylene glycol diacrylate, diethylene glycol dimethacrylate, triethylene glycol dimethacrylate, tripropylene glycol diacrylate, tripropylene glycol dimethacrylate, tetraethylene glycol diacrylate, tetraethylene glycol dimethacrylate, , pentaethylene glycol diacrylate, pentaethylene glycol dimethacrylate, pentapropylene glycol diacrylate, pentapropylene glycol dimethacrylate, propoxylated (3) trimethylolpropane triacrylate, propoxylated (6) trimethylolpropane triacrylate, ethoxylated (3) trimethylolpropane triacrylate, ethoxylated (6) trimethylolpropane triacrylate, ethoxylated (9) trimethylolpropane triacrylate, propoxylated trimethylolpropane triacrylates, propoxylated trimethylolpropane trimethacrylates, ethoxylated (2) bisphenol A dimethacrylate, ethoxylated (3) bisphenol A diacrylate, ethoxylated (4) bisphenol A dimethacrylate, ethoxylated (8) bisphenol A diacrylate, ethoxylated (4) bisphenol A diacrylate, ethoxylated (6) bisphenol A diacrylate, ethoxylated (6) bisphenol A dimethacrylate, propoxylated (2) neopentyl glycol diacrylate, propoxylated (3) glyceryl triacrylate, polyethylene glycol diacrylates, polyethylene glycol dimethacrylates, polypropylene glycol diacrylates, polypropylene glycol dimethacrylates, 2-(2-ethoxyethoxy)ethyl acrylate, ethoxylated (4) pentaerythritol tetraacrylate, highly propoxylated (5.5) glyceryl triacrylate, ethoxylated glyceryl triacrylate, and propoxylated (3) glyceryl triacrylate.

For c), the nonionic surfactant is preferably selected from alkoxylated alcohol, alkoxylated alkyl phenol, or mixtures thereof, more preferably an alkoxylated alcohol and even more preferably a $C_{8-12}$ alcohol ethoxylated with from about 5 to 12 moles of ethylene oxide.

For d), preferably, two or more photoinitiators are used.

More preferred compositions include at least one amine modified acrylic oligomer, leveling agent, and one or more solvents.

DETAILED DESCRIPTION OF THE INVENTION

The present invention provides compositions that are useful in negative acting resists and that are sensitive to imaging radiation. The compositions of the present invention typically exhibit good resolution along with enhanced clean development without sacrificing development speed to an undesired extent.

The present invention is related to a composition which comprises a) a photopolymerizable compound containing at least two pendant unsaturated groups; b) at least one ethylenically unsaturated photopolymerizable polyalkylene oxide hydrophilic monomer; c) at least one nonionic surfactant; and d) at least one photoinitiator.

Preferred compositions according to the present invention can also include one or more components selected from at least one amine modified acrylic oligomer, dyes, adhesion promoters, leveling agents, photosensitizers, solvents and the like.

The present invention is also related to a process for forming a pattern of photoresist. The process comprises:
1) providing on a substrate a layer of a photoresist composition comprising a) a photopolymerizable compound containing at least two pendant unsaturated groups; b) at least one ethylenically unsaturated photopolymerizable polyalkylene oxide hydrophilic monomer; c) at least one nonionic surfactant; and d) at least one photoinitiator;
2) imagewise exposing the layer to actinic radiation in a pattern to thereby cause a change in the solubility of the photoresist where exposed; and
3) developing the photoresist to thereby form the pattern.

A further aspect of the present invention relates to forming a pattern on a substrate. The process comprises:
1) providing on a substrate a layer of a resist composition which comprises: a) a photopolymerizable compound containing at least two pendant unsaturated groups; b) at least one ethylenically unsaturated photopolymerizable polyalkylene oxide hydrophilic monomer; c) at least one nonionic surfactant; and d) at least one photoinitiator
2) imagewise exposing the layer of resist composition to irradiation;
3) developing the resist to form the desired pattern of vias; and
4) depositing electrically conductive material in the vias to form a desired pattern of electrical interconnections; and
5) removing the resist.

In the above processes, a) can preferably be a compound as described below and b) can be selected from the ethylenically unsaturated photopolymerizable polyalkylene oxide hydrophilic monomers described below.

The composition of the present invention comprises, as one component, a) a photopolymerizable compound containing at least two pendant unsaturated reactive groups. One example of a pendant unsaturated reactive group is an ethylenic group.

There are numerous such compounds found in the literature and a) the photopolymerizable compound can be further described as a compound selected from the group consisting of (i) a compound having the formula:

more $C_{3-12}$ cycloalkyl, cyano, $C_{1-5}$ alkyl, $C_{1-6}$ alkoxy, $C_{6-20}$ aryloxy, $C_{1-20}$ aralkyloxy, 2,3-epoxy propyl, hydroxyl, or halogen groups;

$R_3$ is selected from the group consisting of hydrogen, $C_{1-50}$ alkyl, $C_{6-20}$ aryl, $C_{1-20}$ alkaryl, $C_{1-20}$ aralkyl, $C_{3-18}$ cycloalkyl, $C_{2-20}$ alkenyl, cyano, 2,3-epoxy pro and halogen, the $C_{1-50}$ alkyl, $C_{6-20}$ aryl, $C_{1-20}$ alkaryl, $C_{1-20}$ aralkyl, $C_{3-18}$ cycloalkyl, and $C_{2-20}$ alkenyl being unsubstituted or substituted by one or more $C_{3-12}$ cycloalkyl, cyano, $C_{1-5}$ alkyl, $C_{1-6}$ alkoxy, $C_{6-20}$ aryloxy, $C_{1-20}$ aralkyloxy, 2,3-epoxy propyl, hydroxyl, or halogen groups;

$R_4$, $R_6$, and $R_{6a}$ may be the same or different and each may independently be selected from the group consisting of hydrogen, cyano, $C_{1-50}$ alkyl, $C_{6-20}$ aryl, $C_{1-20}$ alkaryl, $C_{1-20}$ aralkyl, $C_{3-18}$ cycloalkyl, $C_{2-20}$ alkenyl, halogen, an oxyalkylated group containing from 2 to 4 carbon atoms in each oxyalkylated group, which group may be of 1 to 20 repeating units and which terminates with hydrogen or $C_{1-4}$ alkyl, X, and $—(CH_2)_n—C(=O)—OR_7$, where $R_7$ is selected from hydrogen, $C_{1-50}$ alkyl, $C_{6-20}$ aryl, $C_{1-20}$ alkaryl, $C_{1-20}$ aralkyl, $C_{2-20}$ alkenyl, $C_{5-50}$ carbocyclic ring, $NR_{7a}R_{7b}$, 2,3-epoxy propyl, n is a whole number from 0 to 3, the $C_{1-50}$ alkyl, $C_{6-20}$ aryl, $C_{1-20}$ alkaryl, $C_{1-20}$ aralkyl, $C_{3-18}$ cycloalkyl, $C_{2-20}$ alkenyl, and $C_{5-50}$ carbocyclic ring being unsubstituted or substituted by one or more $C_{3-12}$ cycloalkyl, cyano, $C_{1-5}$ alkyl, $C_{1-6}$ alkyoxy, $C_{6-20}$ aryloxy, $C_{1-20}$ aralkyloxy, 2,3-epoxy propyl, hydroxyl, or halogen groups, each of $R_{7a}$ and $R_{7b}$ are independently hydrogen or $C_{1-20}$ alkyl and X is $—C(=O)—R_{10}$ or $—R_{60}—C(=O)—CH_2—R_{70}$ where $R_{10}$ is selected from the group consisting of $—O—R_{11}—O—C(=O)—C(R_{12})=CH_2$, $—O—R_{11}—NH—O—C(=O)—C(R_{12})=CH_2$, and $—NH—R_{11}—O—C(=O)—C(R_{12})=CH_2$, where $R_{11}$ is a linear or branched, divalent $C_{1-40}$ alkylene or an oxyalkylated derivative thereof containing from 2 to 4 carbon atoms in each oxylalkylated group, which group may be of 1 to 20 repeating units; $R_{60}$ is $—C(=O)—W—R_{11}—V—$; each of W and V are independently selected from O, S or $NR_{100}$ where $R_{100}$ is hydrogen or $C_{1-6}$ alkyl; $R_{11}$ is as above, $R_{70}$ is $—C(=O)—R_{50}$ or -cyano, where $R_{50}$ is hydrogen or $C_{1-10}$ alkyl;

$R_{12}$ is hydrogen or $C_{1-5}$ alkyl;

$R_5$ and $R_{5a}$ may be the same or different and each may be independently selected from the group consisting of hydrogen, $C_{1-50}$ alkyl, $C_{6-20}$ aryl, $C_{1-20}$ alkaryl, $C_{1-20}$ aralkyl, $C_{3-18}$ cycloalkyl, $C_{2-20}$ alkenyl, cyano, 2,3-epoxy propyl, halogen and carboxy, the $C_{1-50}$ alkyl, $C_{6-20}$ aryl, $C_{1-18}$ alkaryl, $C_{1-20}$

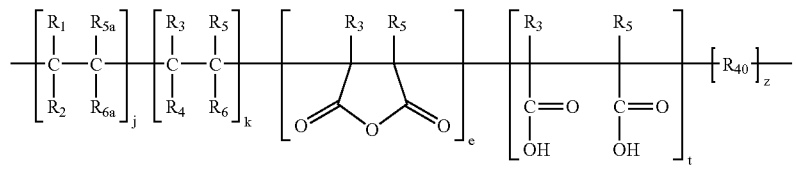

wherein $R_1$ and $R_2$ may be the same or different and each may independently be selected from the group consisting of hydrogen, $C_{1-50}$ alkyl, $C_{6-20}$ aryl, $C_{1-20}$ alkaryl, $C_{1-20}$ aralkyl, $C_{1-10}$ alkoxy, $C_{3-18}$ cycloalkyl, $C_{2-20}$ alkenyl, 2,3-epoxy propyl, cyano, and halogen, the $C_{1-50}$ alkyl, $C_{6-20}$ aryl, $C_{1-20}$ alkaryl, $C_{1-20}$ aralkyl, $C_{1-10}$ alkoxy, $C_{3-18}$ cycloalkyl, and $C_{2-20}$ alkenyl being unsubstituted or substituted by one or aralkyl, $C_{2-20}$ alkenyl, and $C_{3-12}$ cycloalkyl being unsubstituted or substituted by one or more $C_{3-12}$ cycloalkyl, cyano, $C_{1-5}$ alkyl, $C_{1-6}$ alkoxy, $C_{6-20}$ aryloxy, $C_{1-20}$ aralkyloxy, 2,3-epoxy propyl, hydroxyl, or halogen groups; and $R_{40}$ is any monomer that is copolymerizable with moieties found in [ ]$_j$, [ ]$_k$, [ ]$_e$, and/or [ ]$_t$, including those moieties identified for [ ]$_j$, [ ]$_k$, [ ]$_e$, and/or [ ]$_t$; and j, k, e, t, and z are each whole numbers such that the sum of j, k, e, t, and z ranges from about 2 to about 20, with j and k each being equal to or greater than 1, and z, e and/or t may be zero;

(ii) a compound having the formula

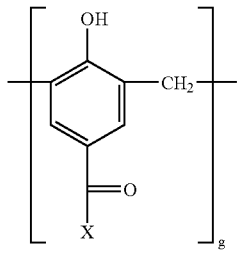

where g is an integer of 3 to 10 and X is as described above; and (iii) a compound having the formula

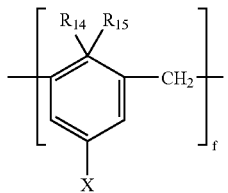

where f is an integer of 3 to 10; $R_{14}$ and $R_{15}$ may be the same or different and each may independently be selected from the group consisting of hydrogen and $C_{1-20}$ alkyl, the $C_{1-20}$ alkyl being unsubstituted or substituted by one or more $C_{3-12}$ cycloalkyl, cyano, $C_{1-5}$ alkyl, or halogen groups; and X is as described above.

More preferably, a) is compound (i) having the formula

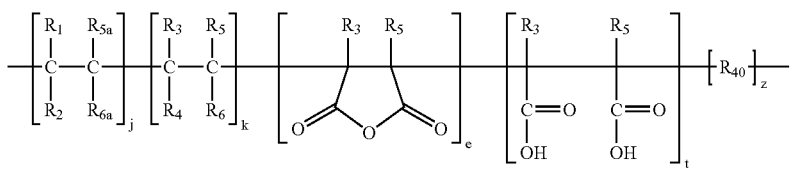

wherein either $R_1$ is hydrogen and $R_2$ is $C_{6-10\ 20}$ aryl unsubstituted or substituted by one or more $C_{3-12}$ cycloalkyl, $C_{1-6}$ alkoxy, 2,3-epoxy propyl, hydroxyl, cyano, $C_{1-5}$ alkyl, or halogen groups; $R_{5a}$ is hydrogen; $R_{6a}$ is hydrogen; $R_3$ is hydrogen; $R_4$ in is —$(CH_2)_n$—$C(=O)$—$OR_7$, where $R_7$ is hydrogen, and n is 0; $R_5$ is hydrogen; $R_6$ in is X where X is —$C(=O)$—$R_{10}$ where $R_{10}$ is —O—$R_{11}$—O—$C(=O)$—$C(R_{12})=CH_2$, $R_{11}$ is a $C_2$ alkylene, $R_{12}$ is hydrogen; e and t are each not zero, and z is zero; or $R_1$ is hydrogen and $R_2$ is $C_{6-10\ 20}$ aryl unsubstituted or substituted by one or more $C_{3-12}$ cycloalkyl, $C_{1-6}$ alkoxy, 2,3-epoxy propyl, hydroxyl, cyano, $C_{1-5}$ alkyl, or halogen groups; $R_{5a}$ is hydrogen; $R_{6a}$ is hydrogen; $R_3$ is hydrogen; $R_4$ in is —$(CH_2)_n$—$C(=O)$—$OR_7$, where $R_7$ is hydrogen, and n is 0; $R_5$ is hydrogen; $R_6$ in is X where X is —$C(=O)$—$R_{10}$ where $R_{10}$ is —O—$R_{11}$—O—$C(=O)$—$C(R_{12})=CH_2$, $R_{11}$ is a $C_2$ alkylene, $R_{12}$ is hydrogen; each of e, t and z are not zero; and $R_{40}$ is

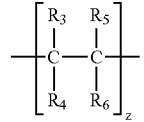

where $R_3$ in $[\ ]_z$ and $R_5$ in $[\ ]_z$ are hydrogen, $R_4$ in $[\ ]_z$ is —$(CH_2)_n$—$C(=O)$—$OR_7$, where $R_7$ is hydrogen, n is 0; $R_6$ in $[\ ]_z$ is —$(CH_2)_n$—$C(=O)$—$OR_7$, where $R_7$ is $C_{1-50}$ alkyl substituted by $C_{1-6}$ alkoxy, and n is 0; or $R_1$ is hydrogen and $R_2$ is $C_{6-10\ 20}$ aryl unsubstituted or substituted by one or more $C_{3-12}$ cycloalkyl, $C_{1-6}$ alkoxy, 2,3-epoxy propyl, hydroxyl, cyano, $C_{1-5}$ alkyl, or halogen groups; $R_{5a}$ is hydrogen; $R_{6a}$ is hydrogen; $R_3$ is hydrogen; $R_4$ in is —$(CH_2)_n$—$C(=O)$—$OR_7$, where $R_7$ is hydrogen, and n is 0; $R_5$ is hydrogen; $R_6$ in is X where X is —$C(=O)$—$R_{10}$ where $R_{10}$ is —O—$R_{11}$—O—$C(=O)$—$C(R_{12})=CH_2$, $R_{11}$ is a $C_2$ alkylene, $R_{12}$ is hydrogen; and each of e, t and z are each zero.

Examples of monomers for (i) above include acid functional and non-acid functional monomers such as, for example, and not limited to, acrylic acid, methacrylic acid, maleic acid, maleic anhydride, fumaric acid, fumaric anhydride, citraconic acid, citraconic anhydride, itaconic acid, itaconic anhydride, vinyl carboxylic acid, 2-acrylamido-2-methylpropanesulfonic acid, 2-hydroxyethyl acryloyl phosphate, 2-hydroxypropyl acryloyl phosphate, 2-hydroxy-α-acryloyl phosphate, and the like; esters of acrylic acids, for example, methyl acrylate, methyl methacrylate, hydroxyl ethyl methacrylate, hydroxyl ethyl acrylate, butyl methacrylate, octyl acrylate, 2-ethoxy ethyl methacrylate, t-butyl acrylate, n-butyl acrylate, 2-ethyl hexylacrylate, n-hexyl acrylate, 2-hydroxyethyl acrylate, 2-hydroxypropyl acrylate, 3-hydroxypropyl acrylate, 2-hydroxybutyl acrylate, 3-hydroxybutyl acrylate, 4-hydroxybutyl acrylate, 2-hydroxyethyl methacrylate, 2-hydroxypropyl methacrylate, 3-hydroxypropyl methacrylate, 2-hydroxybutyl methacrylate, 3-hydroxybutyl methacrylate, 4-hydroxybutyl methacrylate, allyl acrylate, allyl methacrylate, benzyl acrylate, benzyl methacrylate, cyclohexyl acrylate, cyclohexyl methacrylate, methoxypropylene glycol acrylate, methoxypropylene glycol methacrylate, methoxydiethylene glycol acrylate, methoxydiethylene glycol methacrylate, methoxytripropylene glycol acrylate, methoxytripropylene glycol methacrylate, isobornyl acrylate, isobornyl methacrylate, dicyclopentadienyl acrylate, dicyclopentadienyl methacrylate, 2-hydroxy-3-phenoxypropyl acrylate, 2-hydroxy-3-phenoxypropyl methacrylate, mevaloniclactone methacrylate, 2-methyladamantyl methacrylate, isoadamantyl methacrylate, 3-hydroxy-1-methacryloxyadamatane, 3,5-dihydroxy-1-methacryloxyadamantane, β-methacryloxy-γ-butyrolactone, α-methacryloxy-γ-butyrolactone,1,5-pentanediol diacrylate, N,N-diethylaminoethyl acrylate, ethylene glycol diacrylate, 1,3-propanediol diacrylate, decamethylene glycol diacrylate, decamethylene glycol dimethacrylate, 1,4-cyclohexanediol diacrylate, 2,2-dimethylol propane diacrylate, glycerol diacrylate, tripropylene glycol diacrylate, glycerol triacrylate, 2,2-di(p-hydroxyphenyl)-propane dimethacrylate, triethylene glycol diacrylate, polyoxyethyl-2-2-di(p-hydroxyphenyl)-propane dimethacrylate, triethylene glycol dimethacrylate, polyoxypropyltrimethylol propane triacrylate, ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, 1,4-benzenediol dimethacrylate, 2-acetoacetoxyethylmethacrylate, 2-acetoacetoxyethylacrylate, 3-acetoacetoxypropylmethacrylate, 3-acetoacetoxypropylacrylate, 2-acetoacetoamidoethylmethacrylate, and 2-acetoacetoamidoethylacrylate; aromatic vinyl compounds such as styrene, α-methylstyrene, dimethylstyrene, trimethylstyrene, ethylstyrene, isopropylstyrene, o-methoxystyrene, m-methoxystyrene, p-methoxystyrene, o-vinyltoluene, m-vinyltoluene, p-vinyltoluene, o-vinylbenzyl methyl ether, m-vinylbenzyl methyl ether, p-vinylbenzyl methyl ether, o-vinylbenzyl glycidyl ether, m-vinylbenzyl glycidyl ether, p-vinylbenzyl glycidyl ether, acetoxystyrene, chlorostyrene, dichlorostyrene, bromostyrene, vinylbenzoic acid methyl ester, etc., divinylbenzene, and vinyl toluene and vinyl esters, such as vinyl acrylate and vinyl methacrylate, and the like.

By the term "aryl" is meant a radical derived from an aromatic hydrocarbon by the elimination of one atom of hydrogen and can be substituted or unsubstituted. The aromatic hydrocarbon can be mononuclear or polynuclear. Examples of aryl of the mononuclear type include phenyl, tolyl, xylyl, mesityl, cumenyl, and the like. Examples of aryl of the polynuclear type include naphthyl, anthryl, phenanthryl, and the like. The aryl group can have at least one substituent selected from, as for example, halogen, hydroxy, cyano, carboxy, nitro, amino, lower alkyl, lower alkoxy, and the like.

As used herein, the term "alkaryl" means an aryl group bearing an alkyl group; the term "aralkyl" means an alkyl group bearing an aryl group; the term "arylalkaryl" means an aryl group bearing an alkyl group bearing an aryl group By the term "carbocyclic ring" is meant an unsubstituted or substituted, saturated, unsaturated or aromatic, hydrocarbon ring radical. Carbocyclic rings are monocyclic or are fused, bridged or spiro polycyclic ring systems. Examples include norbornene, adamantane, and tetracyclododecene. The substituents on the carbocyclic ring may be aliphatic or cycloaliphatic alkyls, esters, acids, hydroxyl, nitrile, alkyl derivatives, and the like.

As used herein, "aralkyloxy" is an oxygen radical having an aralkyl substituent.

As used herein, "aryloxy" is an oxygen radical having an aryl substituent (i.e., —O-aryl).

For (ii), these can be made from condensation product of phenol, or its derivatives, and formaldehyde. For (ii) and (iii), these are more fully described in U.S. Pat. No. 3,825,430.

The a) photopolymerizable compound of the present composition is preferably a medium molecular weight oligomer or low molecular weight polymer. The weight average molecular weight of the oligomer or polymer is typically about 20,000 or less; more typically about 2,000 to about 20,000 and preferably about 2,000 to about 10,000. The lower molecular weight has the advantage of being more soluble and thus faster and cleaner development in the unexposed area.

Examples of a) photopolymerizable compound include styrene/maleic anhydride oligomers which have been partially esterified with ethylenic unsaturation, preferably, acrylic or methacrylic functionality. A typical styrene/maleic anhydride oligomer is a copolymer of styrene and maleic anhydride with a mole ratio of about 1:1 but can range from 1:4 to 4:1. The styrene/maleic anhydride oligomer is available, for example as SMA-1000, SMA-2000, and SMA-3000 (Sartomer Company) and are described in U.S. Pat. Nos. 3,825,430; 4,820,773; and 6,074,436, the contents relating to such styrene/maleic anhydride resins being incorporated by reference. The styrene/maleic anhydride oligomer can then be reacted with, for example, a hydroxyalkylacrylyl or HO—X, where X is defined above (examples of which include hydroxyethyl acrylate, hydroxyethyl methacrylate, hydroxypropyl acrylate, hydroxypentyl methacrylate). This kind of reaction is described in, for example, U.S. Pat. No. 3,825,430. Styrene/maleic anhydride half-ester oligomers are also available from Sartomer Company under the SARBOX® tradename.

Other examples of a) photopolymerizable compounds include those found in U.S. Pat. Nos. 4,722,947; 4,745,138; and 5,137,952.

The amount of a) photopolymerizable compounds in the composition ranges from about 30 to about 55% by weight, and more typically from about 35 to about 50% by weight.

The compositions of the present invention also contain b) at least one ethylenically unsaturated photopolymerizable polyalkylene oxide hydrophilic monomer which typically crosslinks by photo-induced free radical polymerization forming the desired insoluble pattern. The polyalkyene oxide segment should typically be long enough to render a certain degree of aqueous solubility, but not too long to compromise physical-chemical properties of the crosslinked material to be able to withstand a post image process such as metal plating. Herein, alkylene oxide refers to ethylene or propylene oxide and poly- means 1 or more, for example 1 to 100, more preferably 2 to 10.

The hydrophilic polyalkylene oxide monomer typically has a multi (that is, 2 or more) α,β-ethylenically unsaturated function and from 2 to 10 ethylene oxide or propylene oxide units. In such monomers, the α,β-ethylenically unsaturated moieties, typically acrylic or methacrylic units, are esterified with the alkylene oxide units. The ethylene and/or propylene oxide units render the monomers hydrophilic and therefore more compatible with the aqueous developer. Ethylene oxide units are preferred to propylene oxide units as they are more hydrophilic. If propylene oxide units are used, typically a greater number of such units are used per monomer molecule than if ethylene oxide units were used.

Examples of the at least one ethylenically unsaturated photopolymerizable polyalkylene oxide hydrophilic monomer include, but are not limited to, diethylene glycol diacrylate, triethylene glycol diacrylate, diethylene glycol dimethacrylate, triethylene glycol dimethacrylate, tripropylene glycol diacrylate, tripropylene glycol dimethacrylate, tetraethylene glycol diacrylate, tetraethylene glycol dimethacrylate, pentaethylene glycol diacrylate, pentaethylene glycol dimethacrylate, pentapropylene glycol diacrylate, pentapropylene glycol dimethacrylate, propoxylated (3) trimethylolpropane triacrylate, propoxylated (6) trimethylolpropane triacrylate, ethoxylated (3) trimethylolpropane triacrylate, ethoxylated (6) trimethylolpropane triacrylate, ethoxylated (9) trimethylolpropane triacrylate, propoxylated trimethylolpropane triacrylates, propoxylated trimethylolpropane trimethacrylates, ethoxylated (2) bisphenol A dimethacrylate, ethoxylated (3) bisphenol A diacrylate, ethoxylated (4) bisphenol A dimethacrylate, ethoxylated (8) bisphenol A diacrylate, ethoxylated (4) bisphenol A diacrylate, ethoxylated (6) bisphenol A diacrylate, ethoxylated (6) bisphenol A dimethacrylate, propoxylated (2) neopentyl glycol diacrylate, propoxylated (3) glyceryl triacrylate, polyethylene glycol diacrylates, polyethylene glycol dimethacrylates, polypropylene glycol diacrylates, polypropylene glycol dimethacrylates, ethoxylated (4) pentaerythritol tetraacrylate, highly propoxylated (5.5) glyceryl triacrylate, ethoxylated glyceryl triacrylate, and propoxylated (3) glyceryl triacrylate, and the like. Examples of the foregoing can be obtained from Sartomer Company (Exton, Pa.). Further examples of hydrophilic polyalkylene oxide monomers can be found in U.S. Pat. Nos. 3,368,900, 3,380,831, and 4,180,474.

The amount of the hydrophilic polyalkylene oxide monomer is typically present in the composition in amounts of from about 5 to about 35% by weight, and more typically about 10 to about 20% by weight in the composition.

The compositions of the present invention also contain c) at least one nonionic surfactant. The surfactant, it is believed, promotes wetting of the aqueous developer to the hydrophobic resist and provide for residue free patterns.

Examples of nonionic surfactants include, but are not limited to, alkyl ethoxylated surfactants, block copolymer surfactants, and sorbitan ester surfactants as well as those well known to those skilled in the art.

One type of nonionic surfactant is alkyl alkoxylated surfactant, such as addition products of ethylene oxide, or propylene oxide, with fatty alcohols, fatty acids, fatty amines, etc. Optionally, addition products of mixtures of ethylene oxide and propylene oxide with fatty alcohols, fatty acids, fatty amines can be used. The alkoxylated surfactant includes compounds having the general formula:

$R^8\text{-}Z\text{-}(A)_s B$ wherein $R^8$ is an alkyl group or an alkyl aryl group, selected from the group consisting of primary, secondary and branched chain alkyl groups, primary, secondary and branched chain alkenyl groups, and/or primary, secondary and branched chain alkyl- and alkenyl-substituted phenolic groups having from about 6 to about 20 carbon atoms, preferably from about 8 to about 18, more preferably from about 10 to about 15 carbon atoms; s is an integer from about 2 to about 50, preferably from about 2 to about 20, more preferably from about 2 to about 15; A is EO (ethylene oxide), PO (propylene oxide) or mixtures thereof; B is hydrogen, a carboxylate group, or a sulfate group; and linking group Z is selected from the group consisting of: —O—, —N(R)$_x$—, —C(O)O—, —C(O)N(R)—, —C(O)N(R)—, and mixtures thereof, in which R, when present, is $R^8$, a lower alkyl with about 1 to about 4 carbons, a polyalkylene oxide, or hydrogen, and x is 1 or 2.

Further specific examples of these nonionic surfactants include, inter alia, condensation products of alkylene oxide groups with an organic hydrophobic compound, such as an aliphatic compound or with an alkyl aromatic compound. The nonionic surfactants generally are the condensation products of an organic aliphatic or alkyl aromatic hydrophobic compound and hydrophilic ethylene oxide groups. Practically any hydrophobic compound having a carboxy, hydroxy, amido, or amino group with a free hydrogen attached to the nitrogen can be condensed with ethylene (propylene) oxide or with the polyhydration product thereof, polyethylene (or polypropylene) glycol, to form a water soluble nonionic surfactant.

One example of such a nonionic surfactant is the condensation product of one mole of an alkyl phenol having an alkyl group containing from 6 to 12 carbon atoms with from about 5 to 25 moles of an alkylene oxide. Another example of such a nonionic surfactant is the condensation product of one mole of an aliphatic alcohol which may be a primary, secondary or tertiary alcohol having from 6 to 18 carbon atoms with from 1 to about 10 moles of alkylene oxide. Preferred alkylene oxides are ethylene oxides or propylene oxides which may be present singly, or may be both present.

Typical alkoxylated alcohols are nonionic alkoxylated primary or secondary alcohols, and can be represented by the formula (Z is —O— and B is H)

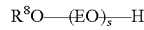
$R^8O\text{---}(EO)_s\text{---}H$ wherein $R^8$ is a $C_{10\text{-}18}$ primary, secondary or branched chain alkyl group and s is an integer from 3–50.

Other examples of nonionic surfactants include primary and secondary linear and branched alcohol ethoxylates, such as those based on $C_6\text{--}C_{18}$ alcohols which further include an average of from 2 to 80 moles of ethoxylation per mol of alcohol. Examples of these nonionic surfactants are available under Neodol® (which, for example, include higher aliphatic, primary alcohol containing about 9–15 carbon atoms, such as $C_{9\text{-}11}$ alkanol condensed with 4 to 10 moles of ethylene oxide (Neodol 91-8 or Neodol 91-5), $C_{12\text{-}13}$ alkanol condensed with 6.5 moles ethylene oxide (Neodol 23-6.5), $C_{12\text{-}15}$ alkanol condensed with 12 moles ethylene oxide (Neodol 25-12), $C_{14\text{-}15}$ alkanol condensed with 13 moles ethylene oxide (Neodol 45-13), and the like) (Shell Chemical Company, Houston, Tex.) or Genapol® series (which, for example, include $C_{12\text{-}16}$ linear alcohols condensed with 1 mole of ethylene oxide (Genapol 24-L-3); $C_{12\text{-}16}$ linear alcohols condensed with 1.6 moles of ethylene oxide (Genapol 26-L-1.6); $C_{12\text{-}16}$ linear alcohols condensed with 2 moles of ethylene oxide (Genapol 26-L-2); $C_{12\text{-}16}$ linear alcohols condensed with 3 moles of ethylene oxide (Genapol 26-L-3); $C_{12\text{-}16}$ linear alcohols condensed with 3 moles of ethylene oxide (Genapol 26-L-5); as well as $C_{12\text{-}16}$ linear alcohols condensed with varying amounts of ethylene oxide to provide specific cloud points of the surfactant (i.e., Genapol 26-L-60, Genapol 26-L-60N, and Genapol 26-L-98N) (Clariant Corporations, Charlotte, N.C.).

Other examples include secondary $C_{12}\text{--}C_{15}$ alcohol ethoxylates, including those which have from about 3 to about 10 moles of ethoxylation. Such are available, for example, in the Tergitol® series of nonionic surfactants (for example, $C_{11\text{-}15}$ secondary alkanol condensed with either 9 EO (Tergitol 15-S-9) or 12 EO (Tergitol 15-S-12) (Dow Chemical, Midland, Mich.).

Some other typical alkoxylated alcohols include ICONOL™ ethoxylated decyl alcohols (oxide content is 4–6 moles of EO), ICONOL™ ethoxylated tridecyl alcohols (oxide content is 3–10 moles of EO), the Macol® lauryl alcohol ethoxylates (oxide content is 4–23 moles of EO), Plurafac® A series stearyl alcohol ethoxylates (oxide content is 25–50 moles of EO) (BASF Corporation), DETROL™ OC alkyl ethoxylates (Dexter Chemical L.L.C.), and TRITON™ alcohol alkoxylate (Rohm & Haas). Other examples are shown in the Examples.

Typical alkoxylated alkylphenols are represented by the formula (Z is —O— and B is H):

$R^8O\text{-}(A)_s\text{H}$ wherein $R^8$ is a $C_{8-18}$ primary, secondary or branched chain alkyl substituted phenolic group, s is an integer of 2–50 and A represents ethylene oxide, propylene oxide and combinations thereof.

Examples of alkoxylated alkylphenols include ICONOL™ nonylphenol ethoxylates, Macol® and Iconol™ octylphenol ethoxylates, (BASF Corporation), DEXTROL™ OC alkylphenol ethoxylates (Dexter Chemical L.L.C.), and TERGITOL™ nonylphenol ethoxylates (Dow Chemical Company). Other examples include Igepal CO-730, Igepal CO-720, Igepal CO-710, Igepal CO-660, Igepal CO-620, and Igepal CO-610, all polyethoxylated nonylphenols and Igepal CO-530 and Igepal CO-520, both ethoxylated nonylphenols from Rhodia Corp.; Alkasurf NP-15, Alkasurf NP-12, Alkasurf NP-11, Alkasurf NP-10, Alkasurf NP-9, and Alkasurf NP-8, all polyethoxylated nonylphenols and Alkasurf NP-6, Alkasurf NP-5, and Alkasurf NP-4, all ethoxylated nonylphenols from Alkaril Chemicals; and Surfonic N-120, Surfonic N-102, Surfonic N-100, Surfonic N-95, and Surfonic N-85, all polyethoxylated nonylphenols and Surfonic N-60 and Surfonic N-40, both ethoxylated nonylphenols from Texaco Chemical Co. See also McCutcheon's Emulsifiers and Detergents (2002) for other examples.

Other examples of nonionic surfactants include block copolymers of ethylene oxide and propylene oxide. Suitable block polyoxyethylene-polyoxypropylene polymeric surfactants include those based on ethylene glycol, propylene glycol, glycerol, trimethylolpropane and ethylenediamine as the initial reactive hydrogen compound. Certain of the block polymer surfactant compounds designated Pluronic and Tetronic (BASF Corp., Mt. Olive, N.J.) are readily available.

Pluronic surfactants have the general formula $\text{H(EO)}_n(\text{PO})_m(\text{EO})_n\text{H}$, wherein EO is an ethylene oxide group, PO is a propylene oxide group, and n and m are numbers that indicate the average number of the groups in the surfactants. Typical examples are: when n is from about 3 to 43, m is from about 16 to 59 with average molecular weights of from about 1800 to about 4700, and mixtures thereof.

Tetronic surfactants have the formula:

$[\text{H(EO)}_n(\text{PO})_m]_2\text{—NCH}_2\text{CH}_2\text{N—}[(\text{PO})_m(\text{EO})_n\text{H}]_2$,
wherein EO, PO, n, and m have the same meanings as above.

"Reverse" Pluronic and Tetronic surfactants have the following general formulas:

Reverse Pluronic surfactants $\text{H(PO)}_m(\text{EO})_n(\text{PO})_m\text{H}$ and Reverse Tetronic surfactants $[\text{H(PO)}_m(\text{EO})_n]_2\text{—NCH}_2\text{CH}_2\text{N—}[(\text{EO})_n(\text{PO})_m\text{H}]_2$ wherein EO, PO, n, and m have the same meanings as above.

Another example of nonionic surfactants include sorbitan esters of long-chain fatty acids which include those having long-chain fatty acid residues with 14 to 26 carbon atoms, desirably 16 to 22 carbon atoms. Furthermore, the esterification degree of the sorbitan polyesters of long-chain fatty acids is desirably 2.5 to 3.5, especially 2.8 to 3.2. Typical examples of these sorbitan polyesters of long-chain fatty acids are sorbitan tripalmitate, sorbitan trioleate, and sorbitan tallow fatty acid triesters. Other suitable sorbitan ester surfactants include sorbitan fatty acid mono- and tri-esters, as well as polyethoxylated sorbitan fatty acid esters.

The nonionic surfactant is preferably selected from alkoxylated alcohol, alkoxylated alkyl phenol, or mixtures thereof, more preferably an alkoxylated alcohol and even more preferably a $C_{8-12}$ alcohol ethoxylated with from about 5 to 12 moles of ethylene oxide.

The amount of c), at least one nonionic surfactant, present in the compositions ranges from about 0.01 to about 4% by weight and more typically from about 0.2 to about 1% by weight in the composition.

The composition of the present invention also contains d) at least one photoinitiator. Suitable photoinitiators include, for example, 9-phenyl acridine, 9-phenyl acridine homologues (such as those described in U.S. Pat. No. 5,217,845, which is incorporated herein by reference; examples of which include 2,7-dibenzoyl-9-phenylacridine, 2,7-bis(α-hydroxybenzyl)-9-phenylacridine, 2,7-bis(α-acetoxybenzyl)-9-phenylacridine, 2,7-dimethyl-9-(4-methyl phenyl) acridine, 2,7-dimethyl-9-phenylacridine, 2,7-bis(3,4-dimethylbenzoyl)-9-(3,4-dimethylphenyl)acridine, 2,7-bis(α-acetoxy-4-tertbutylbenzyl)-9-(4-tert-butylphenyl) acridine, 2,7-dimethyl-9-(3,4-dichlorophenyl)acridine, 2,7-dimethyl-9-(4-benzoylphenyl)acridine, 2,7-bis(2-chlorobenzoyl)-9-(2-chlorophenyl)acridine, 2-(α-hydroxy-3-bromobenzyl)-6-methyl-9-(3-bromophenyl)acridine, 2,5-bis(4-tert-butylbenzoyl)-9-(4-tertbutylphenyl)acridine, 1,4-bis(2,7-dimethyl-9-acridinyl)benzene, 2,7-bis(α-phenylaminocarbonyloxy-3,4-dimethylbenzyl)-9-(3,4-dimethyl phenyl)acridine and 2,7-bis(3,5-dimethyl-4-hydroxy-4'-fluorodiphenylmethyl)-9-(4-fluorophenyl) acridine), acyloins (e.g., benzoin, pivaloin, and the like), acyloin ethers (e.g., benzoin methyl ether, benzoin ethyl ether, benzoin propyl ether, and the like), α-diketone compounds or monoketal derivatives thereof (e.g., diacetyl, benzil, benzyl dimethyl ketal, and the like), hydrogen abstraction-type initiators (e.g., xanthone, thioxanthone, 2-isopropylthioxanthone, 4-isopropylthioxanthone, 2-chlorothioxanthone, 2-methylthioxanthone, benzil, benzophenone, acetophenones, 2,2-diethoxyacetophenone, 2-hydroxy-2-methylpropiophenone, 4-isopropyl-2-hydroxy-2-methylpropiophenone, and 1,1-dichloroacetophenone, 4,4'bis(N,N'-dimethylamino)benzophenone, polynuclear quinones (e.g., 9,10-anthraquinone, 9,10-phenanthrenequinone, 2-ethyl anthraquinone, 1,4-naphthoquinone), and the like), acyl phosphine oxides, and the like, as well as mixtures of any two or more thereof. Further examples of photoinitiators include 2,4-bis-trichloromethyl-6-(3-bromo-4-methoxy)phenyl-s-triazine, 2,4-bis-trichloromethyl-6-(2-bromo-4-methoxy)-phenyl-s-triazine, 2,4-bis-trichloromethyl-6-(3-bromo-4-methoxy)styrylphenyl-s-triazine, 2,4-bis-trichloromethyl-6-(2-bromo-4-methoxy)styrylphenyl-s-triazine, bis(cyclopentadienyl)-bis[2,6-di-fluoro-3-(pyrr-1-yl)phenyl]titanium, bis(cyclopentadienyl)bis[2,6-difluoro-2-(pyrr-1-yl)phenyl]titanium, bis(cyclopentadienyl)-bis(2,3,4,5,6-pentafluorophenyl)titanium, bis-(cyclopentadienyl)-bis[2,5-difluoro-3-(pyrr-1-yl)phenyl]-titanium, 1-hydroxycyclohexyl phenyl ketone, 2,2-dimethoxy-1,2-diphenylethan-1-one, 2-methyl-1-[4-(methylthio)phenyl]-2-morpholinopropan-1-one, 2-benzyl-2-dimethylamino-1-(4-morpholinophenyl)-butan-1-one, 2-hydroxy-2-methyl-1-phenylpropan-1-one, 2,4,6-trimethylbenzoyldiphenylphosphine oxide, 1-[4-(2-hydroxyethoxy)phenyl]-2-hydroxy-2-methyl-1-propan-1-one, 2,4-diethylthioxanthone, 2,4-dimethylthioxanthone, 1-chloro-4-propoxythioxanthone, 3,3-dimethyl-4-methoxybenzophenone, 1-(4-isopropylphenyl)-2-hydroxy-2-methyl-propan-1-one, 1-(4-dodecylphenyl)-2-hydroxy-2-methyl-propan-1-one, 4-benzoyl-4'-methyldimethylsulfide, 4-dimethylaminobenzoic acid, methyl 4-dimethylaminobenzoate, ethyl 4-dimethylaminobenzoate, n-butyl 4-dimethylaminobenzoate, 2-ethylhexyl-4-dimethylaminobenzoate, 2-isoamyl-4-dimethyl aminobenzoate, 2,2-diethoxyacetophenone, benzyl β-methoxyethyl acetal, 1-phenyl-1,2-propanedi-one-2-(o-ethoxycarbonyl)oxime, methyl o-benzoylbenzoate, bis(4-dimethylaminophenyl)ketone, p-dimethylaminoacetophenone, p-tert-butyl-trichloroacetophenone, p-tert-butyl-dichloro-acetophenone, dibenzosuberone, α,α-dichloro-4-phenoxyacetophenone, pentyl 4-dimethylaminobenzoate, 2-(o-chlorophenyl)-4,5-diphenylimidazolyl dimer, α,α-dialkoxyacetophenones, α-hydroxy alkylphenones, α-aminoalkylphenones, and the like. Mixtures of two or more photoinitiators are preferred.

The amount of at least one photoinitator in the composition typically ranges from about 0.01 to about 4% by weight and more typically about 0.1 to about 1% by weight in the composition.

Compositions according to the present invention can also include one or more components selected from dyes, at least one amine modified acrylic oligomer, adhesion promoters, leveling agents, photosensitizers, solvents and the like.

Examples of dyes useful in the present composition include, but are not limited to, those such as Kalle dye (2-diethylamino-4-(2,2 dicyano ethylene)-toluene), to provide background absorption for eliminating development residue induced by actinic light (e.g. UV light) reflected especially by high reflecting substrates such as metals. Of course, other dyes with appropriate UV absorption can also be used. Examples of some other dyes are Victoria Pure Blue FGA (CI Basic Blue 81); Neozapon Fast Red BE (CI Solvent Red 122); Sudan Blue II (CI Solvent Blue 35); Victoria Cyan F6G (CI 42025); Methyl Violet 2B (CI 42535); Crystal Violet (CI 42555); Malachite Green (CI 42000); Neutral Red (CI 50040); Rhodamine FB (CI 45170); Rhodamine 6GCN Extra (CI 45160). The dye is of particular importance when the compositions are used on structures having high reflecting substrates.

The amount of dye, if present the composition, typically ranges from about 0.005 to about 0.2% by weight and more preferably about 0.01 to about 0.1% by weight.

The compositions of the present invention may preferably contain at least one amine modified acrylic oligomer (also known as acrylated amines) as an auxiliary photopolymerizable compound. Some examples of typical amine modified acrylic oligomers can be represented by, for example, one of the following formulae:

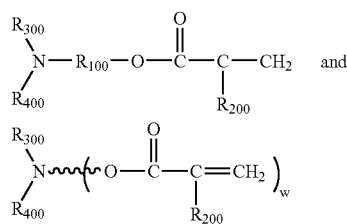

wherein $R_{100}$ is $C_{1-10}$ alkyl, $-(EO)_{aa}-$, $-(PO)_{aa}-$ or

where EO is ethylene oxide, PO is propylene oxide, aa is an integer from 1 to 10, $R_{500}$ and $R_{600}$ each may be the same or different and each independently are $C_{1-10}$ alkyl; $R_{200}$ is hydrogen or $C_{1-6}$ alkyl, and $R_{300}$ and $R_{400}$ each may be the same or different and each independently hydrogen or $C_{1-18}$ alkyl, the alkyl being unsubstituted or substituted with at least one member selected from the group consisting of haloalkyl, $C_{1-4}$ alkoxy, carboxyl, amino, hydroxyl, aryl, sulfonyl, alkoxycarbonyl, aminocarbonyl; and w is an integer from 1 to 10. The amine acrylic oligomer typically has a molecular weight of about 200 to about 2,000. The amine acrylic oligomer can also contain polyalkylene oxide moieties. Some examples of commercially available amine modified acrylate oligomers include Ebecryl® 81, Ebecryl® 83, Ebecryl® 7100 (UCB Chemicals, Smyrna, Ga.), Laromer® PO 77F (LR 8946), Laromer® PO 94 F (LR 8894), Laromer®) LR 8956, Laromer® LR 8996 (BASF, Mt. Olive, N.J.), Actilane 584, Actilane 587, Actilane 595 (Akcros Chemicals, a division of Akzo Nobel NV) and CN501, CN502, CN550, CN551, CN371, CN381, CN383, CN384, CN385 (Sartomer Company, Exton, Pa.).

The amine modified acrylic oligomer, when present in the composition, typically ranges from about 0.1 to about 20% by weight and more typically about 0.5 to about 10% by weight.

Examples of solvents include, for example, a glycol ether derivative such as ethyl cellosolve, methyl cellosolve, propylene glycol monomethyl ether, diethylene glycol monomethyl ether, diethylene glycol monoethyl ether, dipropylene glycol dimethyl ether, propylene glycol n-propyl ether, or diethylene glycol dimethyl ether; a glycol ether ester derivative such as ethyl cellosolve acetate, methyl cellosolve acetate, or propylene glycol monomethyl ether acetate; carboxylates such as ethyl acetate, n-butyl acetate and amyl acetate; carboxylates of di-basic acids such as diethyloxylate and diethylmalonate; dicarboxylates of glycols such as ethylene glycol diacetate and propylene glycol diacetate; and hydroxy carboxylates such as methyl lactate, ethyl lactate, ethyl glycolate, and ethyl-3-hydroxy propionate; a ketone ester such as methyl pyruvate or ethyl pyruvate; an alkoxycarboxylic acid ester such as methyl 3-methoxypropionate, ethyl 3-ethoxypropionate, ethyl 2-hydroxy-2-methylpropionate, or methylethoxypropionate; a ketone derivative such as methyl ethyl ketone, acetyl acetone, cyclopentanone, cyclohexanone or 2-heptanone; a ketone ether derivative such as diacetone alcohol methyl ether; a ketone alcohol derivative such as acetol or diacetone alcohol; lactones such as butyrolactone; an amide derivative such as dimethylacetamide or dimethylformamide, anisole, and mixtures thereof. The amount of solvent(s), when present in the composition, typically ranges from about 30 to about 80% by weight.

Examples of adhesion promoters include benzotriazole and benzotriazole derivatives such as carboxylbenzotriazole. Other examples of benzotriazole derivatives can be found in U.S. Pat. No. 4,428,987. Additional examples of adhesion promoters include amides such as diisopropylacetamide and organosilane materials such as, for example, AP115, an organosilane from Silicon Resources (Chandler, Ariz.). Other examples of organosilane materials which are suitable adhesion promoters include, but are not limited to, N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-(1,3-dimethyl-butyliden) propylamine, N-phenyl-3-aminopropyltrimethoxysilane, 11-aminoundecyltrimethoxysilane, 3-aminopropylmethyldiethoxysilane, 3-aminopropyldimethylethoxysilane, 3-(1-aminopropoxy)-3,3-dimethyl-1-propenyltrimethoxysilane, 6-(aminohexylaminopropyl)trimethoxysilane, bis 3-(trimethoxysilyl)propyldiethylenediamine, trimethoxysilyipropyldiethylenetriamine, (aminoethylaminomethyl)phenethyltrimethoxysilane, 3-glycidoxypropyltimethoxysilane, methacryloxypropyltrimethoxysilane, phenyltriethoxysilane, p-aminophenyl-triethoxysilane, β-(3,4-epoxy-cyclohexyl)-ethyltrimethoxysilane; p-methyldisilane-methyl methacrylate; vinyltrichlorosilane; and tetramethyidivinyidisilazane.

Examples of suitable leveling agents include surfactants such as fluorinated surfactants including fluorosilicone-based non-ionic surface active agent (Megafac R-08, a product by Dainippon Ink Chemical Co.). Additional non-limiting fluorocarbon surfactants include fluorinated alkyl polyoxyalkylene and fluorinated alkyl esters. Representative structures for these compounds are given below:

  (1)

  (2)

where $R_f$ contains from about 6 to about 18 carbons each having from about 0 to about 3 fluorines attached. R is either an alkyl or alkylene oxide group which when present, has from about 1 to about 10 carbons and $R_1$ represents an alkylene radical having from about 1 to about 4 carbons, $R_2$ is either a hydrogen or a small alkyl capping group having from about 1 to about 3 carbons. $R_3$ represents a hydrocarbon moiety comprising from about 2 to about 22 including the carbon on the ester group. This hydrocarbon can be linear, branched or cyclic saturated or unsaturated and can be unsubstituted or substituted. Nonlimiting commercially available examples of these structures include Zonyl 9075, FSO, FSN, FS-300, FS-310, FSN-100, FSO-100, FTS, and TBC from DuPont and Fluorad surfactants FC-430, FC-431, FC-740, FC170C, and FC-171 from the 3M Company in St. Paul, Minn.

When leveling agents are used with the present compositions, they are typically present in an amount ranging from about 0.001 to about 1% by weight, more preferably from about 0.01 to about 0.5% by weight.

The prepared photoresist composition solution can be applied to a substrate by any conventional method used in the photoresist art, including dipping, spraying, whirling and spin coating. When spin coating, for example, the resist solution can be adjusted with respect to the percentage of solids content, in order to provide coating of the desired thickness, given the type of spinning equipment utilized and the amount of time allowed for the spinning process. Suitable substrates include but not limited to such metals as tungsten, gold, copper, titanium, platinum and nickel. The photoresist may also be coated over an antireflective coating.

The photoresist composition solution is then coated onto the substrate, and the substrate is treated at a temperature from about 70° C. to about 150° C. for from about 30 seconds to about 600 seconds on a hot plate or for from about 15 to about 90 minutes in a convection oven. This temperature treatment is selected in order to reduce the concentration of residual solvents in the photoresist, while not causing substantial thermal degradation of the solid components. In general, one desires to minimize the concentration of solvents and the above temperature treatment is conducted until substantially all of the solvents have evaporated and a coating of photoresist composition, on the order of about 10 to 125 microns in thickness, remains on the substrate. In a preferred embodiment the temperature is from about 95° C. to about 120° C. The treatment is conducted until the rate of change of solvent removal becomes relatively insignificant. The temperature and time selection depends on the photoresist properties desired by the user, as well as the equipment used and commercially desired coating times. The coating substrate can then be imagewise exposed to actinic radiation, e.g. ultraviolet radiation, at a wavelength of from about 300 nm to about 500 nm, X-ray, electron beam, ion beam or laser radiation, in any desired pattern, produced by use of suitable masks, negatives, stencils, templates, etc.

The photoresist can optionally be subjected to a post exposure second baking or heat treatment before development. The heating temperatures may range from about 90° C. to about 150° C., and more preferably from about 100° C. to about 130° C. The heating may be conducted for from about 30 seconds to about 2 minutes, and more preferably from about 60 seconds to about 90 seconds on a hot plate or about 30 to about 45 minutes by convection oven.

The exposed photoresist-coated substrates are developed to remove the unexposed areas by immersion in a developing solution or developed by spray development process. The solution is preferably agitated, for example, by nitrogen burst agitation. The substrates are allowed to remain in the developer until all of the photoresist coating has dissolved from the unexposed areas. Developers include aqueous solutions of ammonium or alkali metal hydroxides. One preferred developer is an aqueous solution of tetramethyl ammonium hydroxide. After removal of the patterned substrate from the developing solution, one may conduct an optional post-development heat treatment or bake to increase the coating's adhesion and chemical resistance to post imaging processing. The post-development heat treatment can comprise hot plate or oven baking of the coating and substrate below the coating's softening point or UV hardening process.

The following specific examples provide illustrations of the methods of producing and utilizing compositions of the present invention. These examples are not intended, however, to limit or restrict the scope of the invention in any way and should not be construed as providing conditions, parameters or values which must be utilized exclusively in order to practice the present invention. Unless otherwise specified, all parts and percents are by weight.

Into a suitably sized vessel and under appropriate conditions, the measured amount of components were added in no specific or uniform sequence, which indicated that the order of addition of the constituents was not critical. All of the constituents were supplied at room temperature. The compositions of example formulations are listed on Table 1. The amounts listed in Table 1 are "as is" (as received from the supplier). The identity of the components of used to produce various formulations described herein are disclosed on Table 2 below, including the "actives" percentage of each were a constituent was not 100% wt.

TABLE 1

| Component | Ex. 1 % | Ex. 2 % | Ex. 3 % | Ex. 4 % | Ex. 5 % | Ex. 6 % | Ex. 7 % |
|---|---|---|---|---|---|---|---|
| SB404 | 76.62 | 71.54 | 76.80 | 71.78 | 71.15 | 71.15 | 76.71 |
| SR-268 | 13.88 | 13.48 | 13.91 | 13.52 | 13.41 | 13.41 | 13.9 |
| CBT | 0.18 | 0.19 | 0.18 | | | | 0.18 |
| CN371 | 0.86 | 0.81 | 0.87 | 0.81 | 0.81 | 0.81 | 0.87 |
| Irgacure 907 | 1.77 | 2.30 | 1.42 | 2.31 | 2.29 | 2.29 | 1.42 |
| ITX | 0.27 | 0.61 | 0.17 | 0.61 | 0.61 | 0.61 | 0.17 |
| Kalle G-line Dye | 0.02 | 0.05 | 0.02 | 0.05 | 0.05 | 0.05 | 0.02 |
| Iconol TDA 9 | 0.37 | 0.35 | 0.37 | 0.35 | 0.35 | 0.35 | 0.49 |
| Megafac R08 (90%) | 0.12 | 0.07 | 0.15 | 0.07 | 0.07 | 0.07 | 0.15 |
| AP115 | | | | | | 4.96 | |
| N,N-Diisopropylacetamide | | | | | 0.50 | | |
| EZ dye, 10% | | | 0.12 | | | | 0.12 |
| PGME | 6.00 | 5.98 | 5.99 | 6.00 | 5.95 | 5.95 | 5.98 |
| PGMEA | 0.00 | 4.62 | 0.00 | 4.49 | 4.82 | 0.36 | |
| Total | 100.00 | 100.00 | 100.00 | 100.00 | 100.00 | 100.00 | 100.01 |

TABLE 2

| Component | Name |
|---|---|
| SB404 | Aromatic Acid Acrylate Half Ester (55% Active in PGMEA) (Sartomer) |
| SR-268 | Tetraethylene Glycol Diacrylate (Sartomer) |
| CBT | Carboxy benzotriazole |
| CN371 | Amine modified acrylic oligomer (Sartomer) |
| Irgacure 907 | 2-methyl-1-[4-(methylthio)pheny]-2-morpholinopropan-1-one (Ciba Specialty) |
| ITX | Isopropylthioxanthone |
| Kalle G-line Dye | Dye |
| Iconol TDA 9 | Tridecyl alcohol ethoxylate (9EO) (BASF) |
| Megafac R08 (90%) | Fluorosilicon modified nonionic surfactant (Dainippon Ink Company) (90% Active in PGME prepared solution) |
| AP115 | Organosilane adhesion promoter (10% Active in PGMEA) (Silicon Resources) |
| N,N-Diisopropylacetamide | N,N-Diisopropylacetamide |
| EZ dye, 10% | Dye (10% active in PGME) |
| PGME | Propylene glycol methyl ether (Dow Chemical) |
| PGMEA | Propylene glycol methyl ether acetate (Dow Chemical) |

The resist samples (Ex. 1 to Ex. 7) were spun coated onto the surface of a copper plated 4" silicon wafer to a thickness of 60 µm and baked at 110° C. for 10 minutes to drive out the solvents. The wafer was exposed with a Perkin Elmer 340 aligner at energy of 700–1000 mJ/cm². The development was carried out with 0.261N aqueous solution of tetramethylammonium hydroxide (3×60 seconds puddles). The developed resists exhibited good resolution, clean development, straight profile and no thermal flow when heated to 120° C. Similar results would be expected when the exposed resists were developed with a buffered 0.12N aqueous solution of potassium hydroxide (3×60 seconds puddles), or a buffered 0.08N aqueous solution of potassium hydroxide (4×60 seconds puddles).

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A composition comprising:
   a) a photopolymerizable compound having the formula

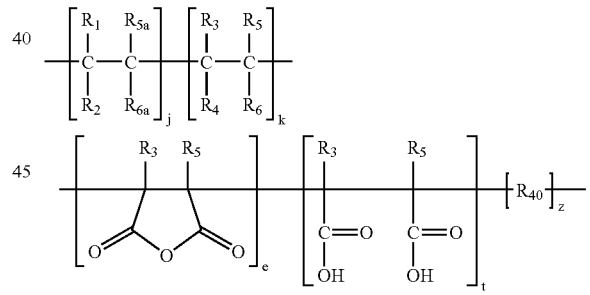

where $R_1$ is hydrogen and $R_2$ is $C_{6-20}$ aryl unsubstituted or substituted by one or more $C_{3-12}$ cycloalkyl, $C_{1-6}$ alkoxy, 2,3-epoxy propyl, hydroxyl, cyano, $C_{1-5}$ alkyl, or halogen groups; $R_{5a}$ is hydrogen; $R_{6a}$ is hydrogen; $R_3$ is hydrogen; $R_4$ is —$(CH_2)_n$—$C(=O)$—$OR_7$, where $R_7$ is hydrogen, and n is 0; $R_5$ is hydrogen; $R_6$ is X where X is —$C(=O)$—$R_{10}$ where $R_{10}$ is —O—$R_{11}$—O—$C(=O)$—$C(R_{12})$=$CH_2$, $R_{11}$ is a $C_2$ alkylene, $R_{12}$ is hydrogen; j, k, e, t, and z are each whole numbers such that the sum of j, k, e, t, and z ranges from about 2 to about 20, with j and k each being equal to or greater than 1, and each of e, t and z are each zero;

b) at least one ethylenically unsaturated photopolymerizable polyalkylene oxide hydrophilic monomer;
   c) at least one nonionic surfactant; and
   d) at least one photoinitiator, which further comprises at least one amine modified acrylic oligomer.

2. The composition of claim 1 wherein b) at least one ethylenically unsaturated photopolymerizable polyalkylene oxide hydrophilic monomer is selected from the group consisting of diethylene glycol diacrylate, triethylene glycol diacrylate, diethylene glycol dimethacrylate, triethylene glycol dimethacrylate, tripropylene glycol diacrylate, tripropylene glycol dimethacrylate, tetraethylene glycol diacrylate, tetraethylene glycol dimethacrylate, pentaethylene glycol diacrylate, pentaethylene glycol dimethacrylate, pentapropylene glycol diacrylate, pentapropylene glycol dimethacrylate, propoxylated (3) trimethylolpropane triacrylate, propoxylated (6) trimethylolpropane triacrylate, ethoxylated (3) trimethylolpropane triacrylate, ethoxylated (6) trimethylolpropane triacrylate, ethoxylated (9) trimethylolpropane triacrylate, propoxylated trimethylolpropane triacrylates, propoxylated trimethylolpropane trimethacrylates, ethoxylated (2) bisphenol A dimethacrylate, ethoxylated (3) bisphenol A diacrylate, ethoxylated (4) bisphenol A dimethacrylate, ethoxylated (8) bisphenol A diacrylate, ethoxylated (4) bisphenol A diacrylate, ethoxylated (6) bisphenol A diacrylate, ethoxylated (6) bisphenol A dimethacrylate, propoxylated (2) neopentyl glycol diacrylate, propoxylated (3) glyceryl triacrylate, polyethylene glycol diacrylates, polyethylene glycol dimethacrylates, polypropylene glycol diacrylates, polypropylene glycol dimethacrylates, 2-(2-ethoxyethoxy)ethyl acrylate, ethoxylated (4) pentaerythritol tetraacrylate, highly propoxylated (5.5) glyceryl triacrylate, ethoxylated glyceryl triacrylate, and propoxylated (3) glyceryl triacrylate.

3. The composition of claim 1 wherein c) at least one nonionic surfactant is selected from alkoxylated alcohol, alkoxylated alkyl phenol, or mixtures thereof.

4. The composition of claim 3 wherein c) at least one nonionic surfactant is an alkoxylated alcohol.

5. The composition of claim 1 wherein the amine modified acrylic oligomer is selected from

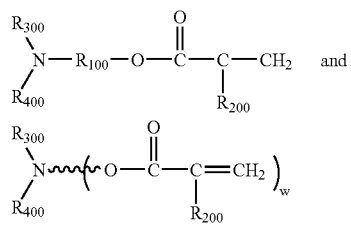

wherein $R_{100}$ is $C_{1-10}$ alkyl, $-(EO)_{aa}-$, $-(PO)_{aa}-$ or

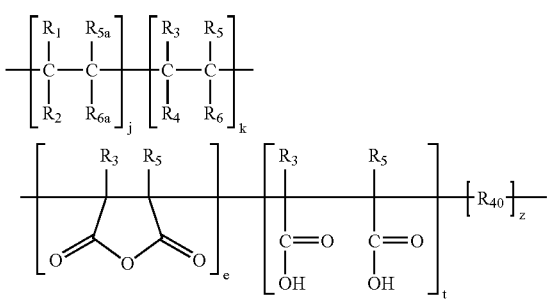

where EO is ethylene oxide, PO is propylene oxide, as is an integer from 1 to 10, $R_{500}$ and $R_{600}$ each may be the same or different and each independently are $C_{1-10}$ alkyl; $R_{200}$ is hydrogen or $C_{1-6}$ alkyl, and $R_{300}$ and $R_{400}$ each may be the same or different and each independently hydrogen or $C_{1-18}$ alkyl, the alkyl being unsubstituted or substituted with at least one member selected from the group consisting of haloalkyl, $C_{1-4}$ alkoxyl, carboxyl, amino, hydroxyl, aryl, sulfonyl, alkoxycarbonyl, aminocarbonyl; and w is an integer from 1 to 10.

6. A process for forming a pattern of photoresist comprising:
1) providing on a substrate a layer of the composition of claim 1;
2) imagewise exposing the layer to actinic radiation in a pattern to thereby cause a change in the solubility of the photoresist where exposed; and
3) developing the photoresist to thereby form the pattern.

7. A composition comprising:
a) a photopolymerizable compound having the formula $$\left[\begin{array}{cc} R_1 & R_{5a} \\ | & | \\ C-C \\ | & | \\ R_2 & R_{6a} \end{array}\right]_j \left[\begin{array}{cc} R_3 & R_5 \\ | & | \\ C-C \\ | & | \\ R_4 & R_6 \end{array}\right]_k$$

$$\left[\begin{array}{c} R_3 \quad R_5 \\ \\ \begin{array}{c} \end{array} \\ O \quad O \quad O \end{array}\right]_e \left[\begin{array}{cc} R_3 & R_5 \\ | & | \\ C=O & C=O \\ | & | \\ OH & OH \end{array}\right]_t [R_{40}]_z$$

wherein $R_1$ and $R_2$ may be the same or different and each may independently be selected from the group consisting of hydrogen, $C_{1-50}$ alkyl, $C_{6-20}$ aryl, $C_{6-20}$ alkaryl, $C_{6-20}$ aralkyl, $C_{1-10}$ alkoxy, $C_{3-18}$ cycloalkyl, $C_{2-20}$ alkenyl, 2,3-epoxy propyl, cyano, and halogen, the $C_{1-50}$ alkyl, $C_{6-20}$ aryl, $C_{6-20}$ alkaryl, $C_{6-20}$ aralkyl, $C_{1-10}$ alkoxy, $C_{3-18}$ cycloalkyl, and $C_{2-20}$ alkenyl being unsubstituted or substituted by one or more $C_{3-12}$ cycloalkyl, cyano, $C_{1-5}$ alkyl, $C_{1-6}$ alkoxy, $C_{6-20}$ aryloxy, $C_{6-20}$ aralkyloxy, 2,3-epoxy propyl, hydroxyl, or halogen groups;

$R_3$ is selected from the group consisting of hydrogen, $C_{1-50}$ alkyl, $C_{6-20}$ aryl, $C_{6-20}$ alkaryl, $C_{6-20}$ aralkyl, $C_{3-18}$ cycloalkyl, $C_{2-20}$ alkenyl, cyano, 2,3-epoxy propyl, and halogen, the $C_{1-50}$ alkyl, $C_{6-20}$ aryl, $C_{6-20}$ alkaryl, $C_{6-20}$ aralkyl, $C_{3-18}$ cycloalkyl, and $C_{2-20}$ alkenyl being unsubstituted or substituted by one or more $C_{3-12}$ cycloalkyl, cyano, $C_{1-5}$ alkyl, $C_{1-6}$ alkoxy, $C_{6-20}$ aryloxy, $C_{6-20}$ aralkyloxy, 2,3-epoxy propyl, hydroxyl, or halogen groups;

$R_4$, $R_6$, and $R_{6a}$ may be the same or different and each may independently be selected from the group consisting of hydrogen, cyano, $C_{1-50}$ alkyl, $C_{6-20}$ aryl, $C_{6-20}$ alkaryl, $C_{6-20}$ aralkyl, $C_{3-18}$ cycloalkyl, $C_{2-20}$ alkenyl, halogen, an oxyalkylated group containing from 2 to 4 carbon atoms in each oxyalkylated group, which group may be of 1 to 20 repeating units and which terminates with hydrogen or $C_{1-4}$ alkyl, X, and $-(CH_2)_n-C(=O)-OR_7$, where $R_7$ is selected from hydrogen, $C_{1-50}$ alkyl, $C_{6-20}$ aryl, $C_{6-20}$ alkaryl, $C_{6-20}$ aralkyl, $C_{2-20}$ alkenyl, $C_{5-50}$ carbocyclic ring, $NR_{7a}R_{7b}$, 2,3-epoxy propyl, n is a whole number from 0 to 3, the $C_{1-50}$ alkyl, $C_{6-20}$ aryl, $C_{6-20}$ alkaryl, $C_{6-20}$ aralkyl, $C_{3-18}$ cycloalkyl, $C_{2-20}$ alkenyl, and $C_{5-50}$ carbocyclic ring being unsubstituted or substituted by one or more $C_{3-12}$ cycloalkyl, cyano, $C_{1-5}$ alkyl, $C_{1-6}$ alkyoxy, $C_{6-20}$ aryloxy, $C_{6-20}$ aralkyloxy, 2,3-epoxy propyl, hydroxyl, or halogen groups, each of $R_{7a}$ and $R_{7b}$ are independently hydrogen or $C_{1-20}$ alkyl and X is $-C(=O)-R_{10}$ or $-R_{60}-C(=O)-CH_2-R_{70}$ where $R_{10}$ is selected from the group consisting of —O—$R_{11}$—O—C(=O)—C($R_{12}$)=$CH_2$, —O—$R_{11}$—NH—C(=O)—C($R_{12}$)=$CH_2$, and —NH—$R_{11}$—O—C(=O)—C($R_{12}$)=$CH_2$, where $R_{11}$ is a linear or branched divalent $C_{1-40}$ alkylene or an oxyalkylated derivative thereof containing from 2 to 4 carbon atoms in each oxylalkylated group, which group may be of 1 to 20 repeating units; $R_{60}$ is —C(=O)—W—$R_{11}$—V—; each of W and V are independently selected from O, S or $NR_{100}$ where $R_{100}$ is hydrogen or $C_{1-6}$ alkyl; $R_{11}$ is as above, $R_{70}$ is —C(=O)—$R_{50}$ or -cyano, where $R_{50}$ is hydrogen or $C_{1-10}$ alkyl; $R_{12}$ is hydrogen or $C_{1-5}$ alkyl;

$R_5$ and $R_{5a}$ may be the same or different and each may be independently selected from the group consisting of hydrogen, $C_{1-50}$ alkyl, $C_{6-20}$ aryl, $C_{6-20}$ alkaryl, $C_{6-20}$ aralkyl, $C_{3-18}$ cycloalkyl, $C_{2-20}$ alkenyl, cyano, 2,3-epoxy propyl, halogen and carboxy, the $C_{1-50}$ alkyl, $C_{6-20}$ aryl, $C_{6-20}$ alkaryl, $C_{6-20}$ aralkyl, $C_{2-20}$ alkenyl, and $C_{3-12}$ cycloalkyl being unsubstituted or substituted by one or more $C_{3-12}$ cycloalkyl, cyano, $C_{1-5}$ alkyl, $C_{1-6}$ alkoxy, $C_{6-20}$ aryloxy, $C_{6-20}$ aralkyloxy, 2,3-epoxy propyl, hydroxyl, or halogen groups; and $R_{40}$ is any monomer that is copolymerizable with moieties found in [ ]$_j$, [ ]$_k$, [ ]$_e$, and/or [ ]$_t$, including those moieties identified for [ ]$_j$, [ ]$_k$, [ ]$_e$, and/or [ ]$_t$, and j, k, and z are each whole numbers such that the sum of J, k, and z ranges from about 2 to about 20, with j and k each being equal to or greater than 1, and z may be zero, and e is an integer from 1 to 25;

b) at least one ethylenically unsaturated photopolymerizable polyalkylene oxide hydrophilic monomer selected from the group consisting of diethylene glycol diacrylate, triethylene glycol diacrylate, diethylene glycol dimethacrylate, triethylene glycol dimethacrylate, tripropylene glycol diacrylate, tripropylene glycol dimethacrylate, tetraethylene glycol diacrylate, tetraethylene glycol dimethacrylate, pentaethylene glycol diacrylate, pentaethylene glycol dimethacrylate, pentapropylene glycol diacrylate, pentapropylene glycol dimethacrylate, propoxylated (3) trimethylolpropane triacrylate, propoxylated (6) trimethylolpropane triacrylate, ethoxylated (3) trimethylolpropane triacrylate, ethoxylated (6) trimethylolpropane triacrylate, ethoxylated (9) trimethylolpropane triacrylate, propoxylated trimethylolpropane triacrylates, propoxylated trimethylolpropane trimethacrylates, ethoxylated (2) bisphenol A dimethacrylate, ethoxylated (3) bisphenol A diacrylate, ethoxylated (4) bisphenol A dimethacrylate, ethoxylated (8) bisphenol A diacrylate, ethoxylated (4) bisphenol A diacrylate, ethoxylated (6) bisphenol A diacrylate, ethoxylated (8) bisphenol A dimethacrylate, propoxylated (2) neopentyl glycol diacrylate, propoxylated (3) glyceryl triacrylate, polyethylene glycol diacrylates, polyethylene glycol dimethacrylates, polypropylene glycol diacrylates, polypropylene glycol dimethacrylates, 2-(2-ethoxyethoxy)ethyl acrylate, ethoxylated (4) pentaerythritol tetraacrylate, highly propoxylated (5.5) glyceryl triacrylate, ethoxylated glyceryl triacrylate, and propoxylated (3) glyceryl triacrylate;

c) at least one nonionic surfactant selected from alkoxylated alcohols, alkoxylated alkyl phenols, and mixtures thereof;

d) at least one photoinitiator; and at feast one amine modified acrylic oligomer.

8. The composition of claim 7 wherein the amine modified acrylic oligomer is selected from

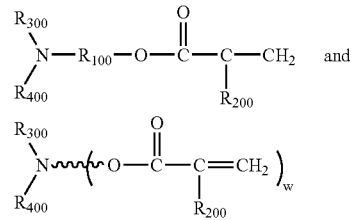

wherein $R_{100}$ is $C_{1-10}$ alkyl, -(EO)$_{aa}$—, —(PO)$_{aa}$— or

where EO is ethylene oxide, PO is propylene oxide, aa is an integer from 1 to 10, $R_{500}$ and $R_{600}$ each may be the same or different and each independently are $C_{1-10}$ alkyl; $R_{200}$ is hydrogen or $C_{1-6}$ alkyl, and $R_{300}$ and $R_{400}$ each may be the same or different and each independently hydrogen or $C_{1-18}$ alkyl, the alkyl being unsubstituted or substituted with at least one member selected from the group consisting of haloalkyl, $C_{1-4}$ alkoxyl, carboxyl, amino, hydroxyl, aryl, sulfonyl, alkoxycarbonyl, aminocarbonyl; and w is an integer from 1 to 10.

9. The composition of claim 7 wherein for a), $R_1$ is hydrogen and $R_2$ is $C_{6-20}$ aryl unsubstituted or substituted by one or more $C_{3-12}$ cycloalkyl, $C_{1-6}$ alkoxy, 2,3-epoxy propyl, hydroxyl, cyano, $C_{1-5}$ alkyl, or halogen groups; $R_{5a}$ is hydrogen; $R_{6a}$ is hydrogen; $R_3$ is hydrogen; $R_4$ is —(CH$_2$)$_n$—C(=O)—OR$_7$, where $R_7$ is hydrogen, and n is 0; $R_5$ is hydrogen; $R_6$ in is X where X is —C(=O)—$R_{10}$ where $R_{10}$ is —O—$R_{11}$—O—C(=O)—C($R_{12}$)=$CH_2$, $R_{11}$ is a $C_2$ alkylene, $R_{12}$ is hydrogen; and each of e, t and z are each zero.

10. A composition comprising a) from about 30 to about 55% by weight of a Photopolymerizable compound having the formula

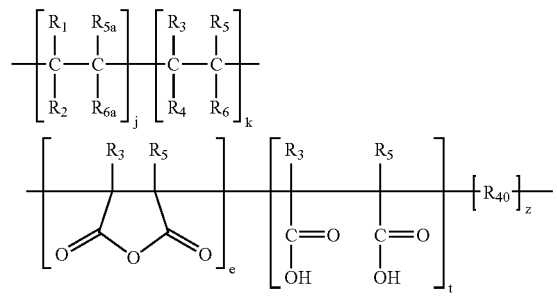

wherein $R_1$ and $R_2$ may be the same or different and each may independently be selected from the group consisting of hydrogen, $C_{1-50}$ alkyl, $C_{6-20}$ aryl, $C_{6-20}$ alkaryl, $C_{6-20}$ aralkyl, $C_{1-10}$ alkoxy, $C_{3-18}$ cycloalkyl, $C_{2-20}$ alkenyl, 2,3-epoxy propyl, cyano, and halogen the $C_{1-50}$ alkyl, $C_{6-20}$ aryl, $C_{6-20}$ alkaryl, $C_{6-20}$ aralkyl, $C_{1-10}$ alkoxy, $C_{3-18}$ cycloalkyl, and $C_{2-20}$ alkenyl being unsubstituted or substituted by one or more $C_{3-12}$ cycloalkyl, cyano, $C_{1-5}$ alkyl, $C_{1-6}$ alkoxy, $C_{6-20}$ aryloxy, $C_{6-20}$ aralkyloxy, 2,3-epoxy propyl, hydroxyl, or halogen groups;

$R_3$ is selected from the group consisting of hydrogen, $C_{1-50}$ alkyl, $C_{6-20}$ aryl, $C_{6-20}$ alkaryl, $C_{6-20}$ aralkyl, $C_{3-18}$ cycloalkyl, $C_{2-20}$ alkenyl, cyano, 2,3-epoxy propyl, and halogen, the $C_{1-50}$ alkyl, $C_{6-20}$ aryl, $C_{6-20}$ alkaryl, $C_{6-20}$ aralkyl, $C_{3-18}$ cycloalkyl, and $C_{2-20}$ alkenyl being unsubstituted or substituted by one or more $C_{3-12}$ cycloalkyl, cyano, $C_{1-5}$ alkyl, $C_{1-6}$ alkoxy, $C_{6-20}$ aryloxy, $C_{6-20}$ aralkyloxy, 2,3-epoxy propyl, hydroxyl, or halogen groups;

$R_4$, $R_6$, and $R_{6a}$ may be the same or different and each may independently be selected from the group consisting of hydrogen, cyano, $C_{1-50}$ alkyl, $C_{6-20}$ aryl, $C_{6-20}$ alkaryl, $C_{6-20}$ aralkyl, $C_{3-18}$ cycloalkyl, $C_{2-20}$ alkenyl, halogen, an oxyalkylated group containing from 2 to 4 carbon atoms in each oxyalkylated group, which group may be of 1 to 20 repeating units and which terminates with hydrogen or $C_{1-4}$ alkyl, X, and $-(CH_2)_n-C(=O)-OR_7$, where $R_7$ is selected from hydrogen, $C_{1-50}$ alkyl, $C_{6-20}$ aryl, $C_{6-20}$ alkaryl, $C_{6-20}$ aralkyl, $C_{2-20}$ alkenyl, $C_{5-50}$ carbocyclic ring, $NR_{7a}R_{7b}$, 2,3epoxy propyl, n is a whole number from 0 to 3, the $C_{1-50}$ alkyl, $C_{6-20}$ aryl, $C_{6-20}$ alkaryl, $C_{6-20}$ aralkyl, $C_{3-18}$ cycloalkyl, $C_{2-20}$ alkenyl, and $C_{5-50}$ carbocyclic ring being unsubstituted or substituted by one or more $C_{3-12}$ cycloalkyl, cyano, $C_{1-5}$ alkyl, $C_{1-6}$ alkyoxy, $C_{6-20}$ aryloxy, $C_{6-20}$ aralkyloxy, 2,3-epoxy propyl, hydroxyl, or halogen groups, each of $R_{7a}$ and $R_{7b}$ are independently hydrogen or $C_{1-20}$ alkyl and X is $-C(=O)-R_{10}$ or $-R_{60}-C(=O)-CH_2-R_{70}$ where $R_{10}$ is selected from the group consisting of $-O-R_{11}-O-C(=O)-C(R_{12})=CH_2$, $-C-R_{11}-NH-C(=O)-C(R_{12})=CH_2$, and $-NH-R_{11}-O-C(=O)-C(R_{12})=CH_2$, where $R_{11}$ is a linear or branched divalent $C_{1-40}$ alkylene or an oxyalkylated derivative thereof containing from 2 to 4 carbon atoms in each oxylalkylated group, which group may be of 1 to 20 repeating units; $R_{60}$ is $-C(=O)-W-R_{11}-V-$; each of W and V are independently selected from O, S or $NR_{100}$ where $R_{100}$ is hydrogen or $C_{1-6}$ alkyl; $R_{11}$ is as above, $R_{70}$ is $-C(=O)-R_{50}$ or -cyano, where $R_{50}$ is hydrogen or $C_{1-10}$ alkyl;

$R_{12}$ is hydrogen or $C_{1-5}$ alkyl;

$R_5$ and $R_{5a}$ may be the same or different and each may be independently selected from the group consisting of hydrogen, $C_{1-50}$ alkyl, $C_{6-20}$ aryl, $C_{6-20}$ alkaryl, $C_{6-20}$ aralkyl, $C_{2-20}$ cycloalkyl, $C_{2-20}$ alkenyl, cyano, 2,3-epoxy propyl, halogen and carboxy, the $C_{1-50}$ alkyl, $C_{6-20}$ aryl, $C_{6-20}$ alkaryl, $C_{6-20}$ aralkyl, $C_{2-20}$ alkenyl, and $C_{3-12}$ cycloalkyl being unsubstituted or substituted by one or more $C_{3-12}$ cycloalkyl, cyano, $C_{1-5}$ alkyl, $C_{1-6}$ alkoxy, $C_{6-20}$ aryloxy, $C_{6-20}$ aralkyloxy, 2,3-epoxy propyl, hydroxyl, or halogen groups; and $R_{40}$ is any monomer that is copolymerizable with moieties found in [ ]$_j$, [ ]$_k$, [ ]$_e$, and/or [ ]$_r$ including those moieties identified for [ ]$_j$, [ ]$_k$, [ ]$_e$, and/or [ ]$_r$; and j, k, and z are each whole numbers such that the sum of j, k, and z ranges from about 2 to about 20, with j and k each being equal to or greater than 1, and z may be zero, and e is an integer from 1 to 25;

b) from about 5 to about 35% by weight of at least one ethylenically unsaturated photopolymerizable polyalkylene oxide hydrophilic monomer selected from the group consisting of diethylene glycol diacrylate, triethylene glycol diacrylate, diethylene glycol dimethacrylate, triethylene glycol dimethacrylate tripropylene glycol diacrylate, tripropylene glycol dimethacrylate tetraethylene glycol diacrylate, tetraethylene glycol dimethacrylate, pentaethylene glycol diacrylate, pentaethylene glycol dimethacrylate pentapropylene glycol diacrylate, pentapropylene glycol dimethacrylate propoxylated (3) trimethylolpropane triacrylate, propoxylated (6) trimethylolpropane triacrylate, ethoxylated (3) trimethylolpropane triacrylate, ethoxylated (6) trimethylolpropane triacrylate, ethoxylated (9) trimethylolpropane triacrylate, propoxylated trimethylolpropane triacrylates propoxylated trimethylolpropane trimethacrylates, ethoxylated (2) bisphenol A dimethacrylate, ethoxylated (3) bisphenol A diacrylate, ethoxylated (4) bisphenol A dimethacrylate, ethoxylated (8) bisphenol A diacrylate, ethoxylated (4) bisphenol A diacrylate, ethoxylated (6) bisphenol A diacrylate, ethoxylated (6) bisphenol A dimethacrylate propoxylated (2) neopentyl glycol diacrylate, propoxylated (3) glyceryl triacrylate, polyethylene glycol diacrylates, polyethylene glycol dimethacrylates, polypropylene glycol diacrylates, polypropylene glycol dimethacrylates, 2-(2-ethoxyethoxy)ethyl acrylate, ethoxylated (4) pentaerythritol tetraacrylate, highly propoxylated (5.5) glyceryl triacrylate, ethoxylated glyceryl triacrylate, and propoxylated (3) glyceryl triacrylate;

c) from about 0.01 to about 4% by weight of at least one nonionic surfactant selected from alkoxylated alcohols, alkoxylated alkyl phenols; and mixtures thereof;

d) from about 0.01 to about 4% by weight of at least one photoinitiator; and from about 0.1 to about 20% by weight of at least one amine modified acrylic oligomer.

11. The composition of claim 10 wherein the amine modified acrylic oligomer is selected from

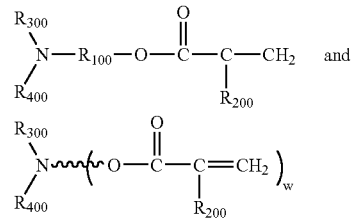

wherein $R_{100}$ is $C_{1-10}$ alkyl, $-(EO)_{aa}-$, $-(PO)_{aa}-$ or where EO is ethylene oxide, PO is propylene oxide, aa is an integer from 1 to 10, $R_{500}$ and $R_{600}$ each may be the same or different and each independently are $C_{1-10}$ alkyl; $R_{200}$ is hydrogen or $C_{1-6}$ alkyl, and $R_{300}$ and $R_{400}$ each may be the same or different and each independently hydrogen or $C_{1-18}$ alkyl, the alkyl being unsubstituted or substituted with at least one member selected from the group consisting of haloalkyl, $C_{1-4}$ alkoxyl, carboxyl, amino, hydroxyl, aryl, sulfonyl, alkoxycarbonyl, aminocarbonyl; and w is an integer from 1 to 10.

12. The composition of claim 10 wherein for a), $R_1$ is hydrogen and $R_2$ is $C_{6-20}$ aryl unsubstituted or substituted by one or more $C_{3-12}$ cycloalkyl, $C_{1-6}$ alkoxy, 2,3-epoxy propyl, hydroxyl, cyano, $C_{1-5}$ alkyl, or halogen groups; $R_{5a}$ is hydrogen; $R_{6a}$ is hydrogen; $R_3$ is hydrogen; $R_4$ is —$(CH_2)_n$—C(=O)—$OR_7$, where $R_7$ is hydrogen, and n is 0; $R_5$ is hydrogen; $R_6$ in is X where X is —C(=O)—$R_{10}$ where $R_{10}$ is —O—$R_{11}$—O—C(=O)—C($R_{12}$)=$CH_2$, $R_{11}$ is a $C_2$ alkylene, $R_{12}$ is hydrogen; and each of e, t and z are each zero.

13. A composition comprising
a) a photopolymerizable compound having the formula

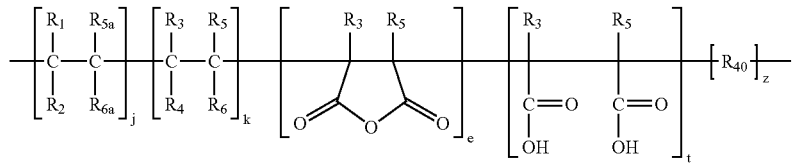

wherein $R_1$ and $R_2$ may be the same or different and each may independently be selected from the group consisting of hydrogen, $C_{1-50}$ alkyl, $C_{6-20}$ aryl, $C_{6-20}$ alkaryl, $C_{6-20}$ aralkyl, $C_{1-10}$ alkoxy, $C_{3-18}$ cycloalkyl, $C_{2-20}$ alkenyl, 2,3-epoxy propyl, cyano, and halogen, the $C_{1-50}$ alkyl, $C_{6-20}$ aryl, $C_{6-20}$ alkaryl, $C_{6-20}$ aralkyl, $C_{1-10}$ alkoxy, $C_{3-18}$ cycloalkyl, and $C_{2-20}$ alkenyl being unsubstituted or substituted by one or more $C_{3-12}$ cycloalkyl, cyano, $C_{1-5}$ alkyl, $C_{1-6}$ alkoxy, $C_{6-20}$ aryloxy, $C_{6-20}$ aralkyloxy, 2,3-epoxy propyl, hydroxyl, or halogen groups;

$R_3$ is selected from the group consisting of hydrogen, $C_{1-50}$ alkyl, $C_{6-20}$ aryl, $C_{6-20}$ alkaryl, $C_{6-20}$ aralkyl, $C_{3-18}$ cycloalkyl, $C_{2-20}$ alkenyl, cyano, 2,3-epoxy propyl, and halogen, the $C_{1-50}$ alkyl, $C_{6-20}$ aryl, $C_{6-20}$ alkaryl, $C_{6-20}$ aralkyl, $C_{3-18}$ cycloalkyl, and $C_{2-20}$ alkenyl being unsubstituted or substituted by one or more $C_{3-12}$ cycloalkyl, cyano, $C_{1-5}$ alkyl, $C_{1-6}$ alkoxy, $C_{6-20}$ aryloxy, $C_{6-20}$ aralkyloxy, 2,3-epoxy propyl, hydroxyl, or halogen groups;

$R_4$, $R_6$, and $R_{6a}$ may be the same or different and each may independently be selected from the group consisting of hydrogen, cyano, $C_{1-50}$ alkyl, $C_{6-20}$ alkaryl, $C_{6-20}$ aralkyl, $C_{3-18}$ cycloalkyl, $C_{2-20}$ alkenyl, halogen, an oxyalkylated group containing from 2 to 4 carbon atoms in each oxyalkylated group, which group may be of 1 to 20 repeating units and which terminates with hydrogen or $C_{1-4}$ alkyl, X, and —$(CH_2)_n$—C(=O)—$OR_7$, where $R_7$ is selected from hydrogen, $C_{1-50}$ alkyl, $C_{6-20}$ aryl, $C_{6-20}$ alkaryl, $C_{6-20}$ aralkyl, $C_{2-20}$ alkenyl, $C_{5-50}$ carbocyclic ring, $NR_{7a}R_{7b}$, 2,3-epoxy propyl, n is a whole number from 0 to 3, the $C_{1-50}$ alkyl, $C_{6-20}$ aryl, $C_{6-20}$ alkaryl, $C_{6-20}$ aralkyl, $C_{3-18}$ cycloalkyl, $C_{2-20}$ alkenyl, and $C_{5-50}$ carbocyclic ring being unsubstituted or substituted by one or more $C_{3-12}$ cycloalkyl, cyano, $C_{1-5}$ alkyl, $C_{1-6}$ alkyoxy, $C_{6-20}$ aryloxy, $C_{6-20}$ aralkyloxy, 2,3-epoxy propyl, hydroxyl, or halogen groups, each of $R_{7a}$ and $R_{7b}$ are independently hydrogen or $C_{1-20}$ alkyl and X is —C(=O)—$R_{10}$ or —$R_{60}$—C(=O)—$CH_2$—$R_{70}$ where $R_{10}$ is selected from the group consisting of —O—$R_{11}$—O—C(=O)—C($R_{12}$)=$CH_2$, —O—$R_{11}$—NH—C(=O)—C($R_{12}$)=$CH_2$, and —NH—$R_{11}$—O—C(=O)—C($R_{12}$)=$CH_2$, where $R_{11}$ is a linear or branched divalent $C_{1-40}$ alkylene or an oxyalkylated derivative thereof containing from 2 to 4 carbon atoms in each oxylalkylated group, which group may be of 1 to 20 repeating units; $R_{60}$ is —C(=O)—W—$R_{11}$—V—; each of W and V are independently selected from O, S or $NR_{100}$ where $R_{100}$ is hydrogen or $C_{1-6}$ alkyl; $R_{11}$ is as above, $R_{70}$ is —C(=O)—$R_{50}$ or -cyano, where $R_{50}$ is hydrogen or $C_{1-10}$ alkyl;

$R_{12}$ is hydrogen or $C_{1-5}$ alkyl; $R_5$ and $R_{5a}$ may be the same or different and each may be independently selected from the group consisting of hydrogen, $C_{1-50}$ alkyl, $C_{6-20}$ aryl, $C_{6-20}$ alkaryl, $C_{6-20}$ aralkyl, $C_{3-18}$ cycloalkyl, $C_{2-20}$ alkenyl, cyano, 2,3-epoxy propyl, halogen and carboxy, the $C_{1-50}$ alkyl, $C_{6-20}$ $C_{6-20}$ alkaryl, $C_{6-20}$ aralkyl, $C_{2-20}$ alkenyl, and $C_{3-12}$ cycloalkyl being unsubstituted or substituted by one or more $C_{3-12}$ cycloalkyl, cyano, $C_{1-5}$ alkyl, $C_{1-6}$ alkoxy, $C_{6-20}$ aryloxy, $C_{6-20}$ aralkyloxy, 2,3-epoxy propyl, hydroxyl, or halogen groups; and $R_{40}$ is any monomer that is copolymerizable with moieties found in [ ]$_j$, [ ]$_k$, [ ]$_e$, and/or [ ]$_t$ including those moieties identified for [ ]$_j$, [ ]$_k$, [ ]$_e$, and/or [ ]$_t$; and j, k, e, t, and z are each whole numbers such that the sum of j, K e, t, and z ranges from about 2 to about 20, with j and k each being equal to or greater than 1, and z, e and/or t may be zero;

b) of at least one ethylenically unsaturated photopolymerizable polyalkylene oxide hydrophilic monomer selected from the group consisting of diethylene glycol diacrylate, triethylene glycol diacrylate, diethylene glycol dimethacrylate, triethylene glycol dimethacrylate, tripropylene glycol diacrylate, tripropylene glycol dimethacrylate, tetraethylene glycol diacrylate, tetraethylene glycol dimethacrylate, pentaethylene glycol diacrylate, pentaethylene glycol dimethacrylate, pentapropylene glycol diacrylate, pentapropylene glycol dimethacrylate, propoxylated (3) trimethylolpropane triacrylate, propoxylated (6) trimethylolpropane triacrylate, ethoxylated (3) trimethylolpropane triacrylate, ethoxylated (6) trimethylolpropane triacrylate, ethoxylated (9) trimethylolpropane triacrylate, propoxylated trimethylolpropane triacrylates, propoxylated trimethylolpropane trimethacrylates, ethoxylated (2) bisphenol A dimethacrylate, ethoxylated (3) bisphenol A diacrylate, ethoxylated (4) bisphenol A dimethacrylate, ethoxylated (8) bisphenol A diacrylate, ethoxylated (4) bisphenol A diacrylate, ethoxylated (6) bisphenol A diacrylate, ethoxylated (6) bisphenol A dimethacrylate, propoxylated (2) neopentyl glycol diacrylate, propoxylated (3) glyceryl triacrylate, polyethylene glycol diacrylates, polyethylene glycol dimethacrylates, polypropylene glycol diacrylates, polypropylene glycol dimethacrylates, 2-(2-ethoxyethoxy)ethyl acrylate, ethoxylated (4) pentaerythritol tetraacrylate, highly propoxylated (5.5) glyceryl triacrylate, ethoxylated glyceryl triacrylate, and propoxylated (3) glyceryl triacrylate;

c) at least one nonionic surfactant selected from alkoxylated alcohols, alkoxylated alkyl phenols, and mixtures thereof;

d) at least one photoinitiator; and at least one amine modified acrylic oligomer.

14. The composition of claim 13 wherein the amine modified acrylic oligomer is selected from

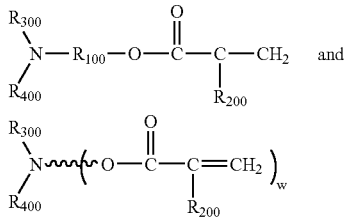

and

wherein $R_{100}$ is $C_{1-10}$ alkyl, $-(EO)_{aa}-$, $-(PO)_{aa}-$ or

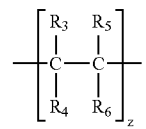

where EO is ethylene oxide, PO is propylene oxide, aa is an integer from 1 to 10, $R_{500}$ and $R_{600}$ each may be the same or different and each independently are $C_{1-10}$ alkyl; $R_{200}$ is hydrogen or $C_{1-6}$ alkyl, and $R_{300}$ and $R_{400}$ each may be the same or different and each independently hydrogen or $C_{1-18}$ alkyl, the alkyl being unsubstituted or substituted with at least one member selected from the group consisting of haloalkyl, $C_{1-4}$ alkoxyl, carboxyl, amino, hydroxyl, aryl, sulfonyl, alkoxycarbonyl, aminocarbonyl; and w is an integer from 1 to 10.

15. The composition of claim 13 wherein for a), $R_1$ is hydrogen and $R_2$ is $C_{6-20}$ aryl unsubstituted or substituted by one or more $C_{3-12}$ cycloalkyl, $C_{1-6}$ alkoxy, 2,3-epoxy propyl, hydroxyl, cyano, $C_{1-5}$ alkyl, or halogen groups; $R_{5a}$ is hydrogen; $R_{6a}$ is hydrogen; $R_3$ is hydrogen; $R_4$ is $-(CH_2)_n-C(=O)-OR_7$, where $R_7$ is hydrogen, and n is 0; $R_5$ is hydrogen; $R_6$ in is X where X is $-C(=O)-R_{10}$ where $R_{10}$ is $-O-R_{11}-O-C(=O)-C(R_{12})=CH_2$, $R_{11}$ is a $C_2$ alkylene, $R_{12}$ is hydrogen; e and t are each not zero, and z is zero.

16. The composition of claim 13 wherein for a), $R_1$ is hydrogen and $R_2$ is $C_{6-20}$ aryl unsubstituted or substituted by one or more $C_{3-12}$ cycloalkyl, $C_{1-6}$ alkoxy, 2,3-epoxy propyl, hydroxyl, cyano, $C_{1-5}$ alkyl, or halogen groups; $R_{5a}$ is hydrogen; $R_{6a}$ is hydrogen; $R_3$ is hydrogen; $R_4$ is $-(CH_2)_n-C(=O)-OR_7$, where $R_7$ is hydrogen, and n is 0; $R_5$ is hydrogen; $R_6$ is X where X is $-C(=O)-R_{10}$ where $R_{10}$ is $-O-R_{11}-O-C(=O)-C(R_{12})=CH_2$, $R_{11}$ is a $C_2$ alkylene, $R_{12}$ is hydrogen; each of e and t are not zero; and $R_{40}$ is $$\left[ \begin{array}{cc} R_3 & R_5 \\ | & | \\ C-C \\ | & | \\ R_4 & R_6 \end{array} \right]_z$$

where $R_3$ in $[\ ]_z$ and $R_5$ in $[\ ]_z$ are hydrogen, $R_4$ in $[\ ]_z$ is $-(CH_2)_n-C(=O)-OR_7$, where $R_7$ is hydrogen, n is 0; $R_6$ in $[\ ]_z$ is $-(CH_2)_n-C(=O)-OR_7$, where $R_7$ is $C_{1-50}$ alkyl substituted by $C_{1-6}$ alkoxy, and n is 0.

17. The composition of claim 13 wherein for a), $R_1$ is hydrogen and $R_2$ is $C_{6-20}$ aryl unsubstituted or substituted by one or more $C_{3-12}$ cycloalkyl, $C_{1-6}$ alkoxy, 2,3-epoxy propyl, hydroxyl, cyano, $C_{1-5}$ alkyl, or halogen groups; $R_{5a}$ is hydrogen; $R_{6a}$ is hydrogen; $R_3$ is hydrogen; $R_4$ is $-(CH_2)_n-C(=O)-OR_7$, where $R_7$ is hydrogen, and n is 0; $R_5$ is hydrogen; $R_6$ is X where X is $-C(=O)-R_{10}$ where $R_{10}$ is $-O-R_{11}-O-C(=O)-C(R_{12})=CH_2$, $R_{11}$ is a $C_2$ alkylene, $R_{12}$ is hydrogen; and each of e, t and z are each zero.

18. A composition comprising
a) a photopolymerizable compound having the formula

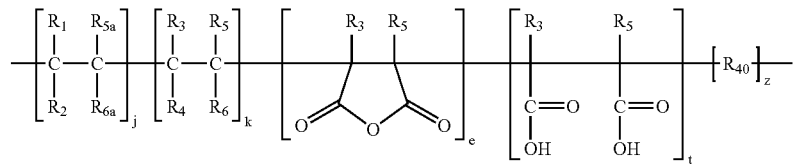

wherein $R_1$ and $R_2$ may be the same or different and each may independently be selected from the group consisting of hydrogen, $C_{1-50}$ alkyl, $C_{6-20}$ aryl, $C_{6-20}$ alkaryl, $C_{6-20}$ aralkyl, $C_{1-10}$ alkoxy, $C_{3-18}$ cycloalkyl, $C_{2-20}$ alkenyl, 2,3-epoxy propyl, cyano, and halogen, the $C_{1-50}$ alkyl, $C_{6-20}$ aryl, $C_{6-20}$ alkaryl, $C_{6-20}$ aralkyl, $C_{1-10}$ alkoxy, $C_{3-18}$ cycloalkyl, and $C_{2-20}$ alkenyl being unsubstituted or substituted by one or more $C_{3-12}$ cycloalkyl, cyano, $C_{1-5}$ alkyl, $C_{1-6}$ alkoxy, $C_{6-20}$ aryloxy, $C_{6-20}$ aralkyloxy, 2,3-epoxy propyl, hydroxyl, or halogen groups;

$R_3$ is selected from the group consisting of hydrogen, $C_{1-50}$ alkyl, $C_{6-20}$ aryl, $C_{6-20}$ alkaryl, $C_{6-20}$ aralkyl, $C_{3-18}$ cycloalkyl, and $C_{2-20}$ alkenyl, cyano, 2,3-epoxy propyl, and halogen, the $C_{1-50}$ alkyl, $C_{6-20}$ aryl, $C_{6-20}$ alkaryl, $C_{6-20}$ aralkyl, $C_{3-18}$ cycloalkyl, and $C_{2-20}$ alkenyl being unsubstituted or substituted by one or more $C_{3-12}$ cycloalkyl, cyano, $C_{1-5}$ alkyl, $C_{1-6}$ alkoxy, $C_{6-20}$ aryloxy, $C_{6-20}$ aralkyloxy, 2,3-epoxy propyl, hydroxyl, or halogen groups;

$R_4$, $R_6$, and $R_{6a}$ may be the same or different and each may independently be selected from the group consisting of hydrogen, cyano, $C_{1-50}$ alkyl, $C_{6-20}$ aryl, $C_{6-20}$ alkaryl, $C_{6-20}$ aralkyl, $C_{3-18}$ cycloalkyl, $C_{2-20}$ alkenyl, halogen, an oxyalkylated group containing from 2 to 4 carbon atoms in each oxyalkylated group, which group may be of 1 to 20 repeating units and which terminates with hydrogen or $C_{1-4}$ alkyl, X, and $(CH_2)_n-C(=O)-OR_7$, where $R_7$ is selected from hydrogen, $C_{1-50}$ alkyl, $C_{6-20}$ aryl, $C_{6-20}$ alkaryl, $C_{6-20}$ aralkyl, $C_{2-20}$ alkenyl, $C_{5-50}$ carbocyclic ring, $NR_{7a}R_{7b}$, 2,3-epoxy propyl, n is a whole number from 0 to 3, the $C_{1-50}$ alkyl, $C_{6-20}$ aryl, $C_{6-20}$ alkaryl, $C_{6-20}$ aralkyl, $C_{3-18}$ cycloalkyl, $C_{2-20}$ alkenyl, and $C_{5-50}$ carbocyclic ring being unsubstituted or substituted by one or more $C_{3-12}$ cycloalkyl, cyano, $C_{1-5}$ alkyl, $C_{1-6}$ alkyoxy, $C_{6-20}$ aryloxy, $C_{6-20}$ aralkyloxy, 2,3-epoxy propyl, hydroxyl, or halogen groups, each of $R_{7a}$ and $R_{7b}$ are independently hydrogen or $C_{1-20}$ alkyl and X is —C(=O)—$R_{10}$ or $R_{60}$—C(=O)—$CH_2$—$R_{70}$ where $R_{10}$ is selected from the group consisting of —O—$R_{11}$—O—C(=O)—C($R_{12}$)=$CH_2$, —O—$R_{11}$—NH—C(=O)—C($R_{12}$)=$CH_2$, and —NH—$R_{11}$—O—C(=O)—C($R_{12}$)=$CH_2$, where $R_{11}$ is a linear or branched divalent $C_{1-40}$ alkylene or an oxyalkylated derivative thereof containing from 2 to 4 carbon atoms in each oxylalkylated group, which group may be of 1 to 20 repeating units; $R_{60}$ is —C(=O)—W—$R_{11}$—V—; each of W and V are independently selected from O, S or $NR_{100}$ where $R_{100}$ is hydrogen or $C_{1-6}$ alkyl; $R_{11}$ is as above, $R_{70}$ is —C(=O)—$R_{50}$ or -cyano, where $R_{50}$ is hydrogen or $C_{1-10}$ alkyl;

$R_{12}$ is hydrogen or $C_{1-6}$ alkyl;

$R_5$ and $R_{5a}$ may be the same or different and each may be independently selected from the group consisting of hydrogen, $C_{1-50}$ alkyl, $C_{6-20}$ aryl, $C_{6-20}$ alkaryl, $C_{6-20}$ aralkyl, $C_{3-18}$ cycloalkyl $C_{2-20}$ alkenyl, cyano, 2,3-epoxy propyl, halogen and carboxy, the $C_{1-50}$ alkyl, $C_{6-20}$ aryl, $C_{6-20}$ alkaryl, $C_{6-20}$ aralkyl, $C_{2-20}$ alkenyl, and $C_{3-12}$ cycloalkyl being unsubstituted or substituted by one or more $C_{3-12}$ cycloalkyl, cyano, $C_{1-5}$ alkyl, $C_{1-6}$ alkoxy, $C_{6-20}$ aryloxy, $C_{6-20}$ aralkyloxy, 2,3-epoxy propyl, hydroxyl, or halogen groups; and $R_{40}$ is any monomer that is copolymerizable with moieties found in [ ]$_j$, [ ]$_k$, [ ]$_e$, and/or [ ]$_t$, including those moieties identified for [ ]$_k$, [ ]$_k$, [ ]$_e$, and/or [ ]$_t$, and j, K e, t, and z are each whole numbers such that the sum of j, k, e, t and z ranges from about 2 to about 20, with j and k each being equal to or greater than 1, and z, e and/or t may be zero;

b) of at least one ethylenically unsaturated photopolymerizable polyalkylene oxide hydrophilic monomer selected from the group consisting of diethylene glycol diacrylate, triethylene glycol diacrylate, diethylene glycol dimethacrylate, triethylene glycol dimethacrylate, tripropylene glycol diacrylate, tripropylene glycol dimethacrylate, tetraethylene glycol diacrylate, tetraethylene glycol dimethacrylate, pentaethylene glycol diacrylate, pentaethylene glycol dimethacrylate, pentapropylene glycol diacrylate, pentapropylene glycol dimethacrylate, propoxylated (3) trimethylolpropane triacrylate, propoxylated (6) trimethylolpropane triacrylate, ethoxylated (3) trimethylolpropane triacrylate, ethoxylated (6) trimethylolpropane triacrylate, ethoxylated (9) trimethylolpropane triacrylate, propoxylated trimethylolpropane triacrylates, propoxylated trimethylolpropane trimethacrylates, ethoxylated (2) bisphenol A dimethacrylate, ethoxylated (3) bisphenol A diacrylate, ethoxylated (4) bisphenol A dimethacrylate, ethoxylated (8) bisphenol A diacrylate, ethoxylated (4) bisphenol A diacrylate, ethoxylated (6) bisphenol A diacrylate, ethoxylated (6) bisphenol A dimethacrylate, propoxylated (2) neopentyl glycol diacrylate, propoxylated (3) glyceryl triacrylate, polyethylene glycol diacrylates, polyethylene glycol dimethacrylates, polypropylene glycol diacrylates, polypropylene glycol dimethacrylates, 2-(2-ethoxyethoxy)ethyl acrylate, ethoxylated (4) pentaerythritol tetraacrylate, highly propoxylated (5.5) glyceryl triacrylate, ethoxylated glyceryl triacrylate, and propoxylated (3) glyceryl triacrylate;

c) at least one nonionic surfactant selected from alkoxylated alcohols, alkoxylated alkyl phenols, and mixtures thereof;

d) at least one photoinitiator; and at least one amine modified acrylic oligomer is selected from

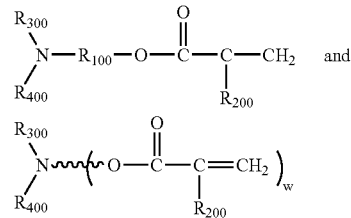

wherein $R_{100}$ is $C_{1-10}$ alkyl, -(EO)$_{aa}$—, —(PO)$_{aa}$— or

where EO is ethylene oxide, PO is propylene oxide, aa is an integer from 1 to 10, $R_{500}$ and $R_{600}$ each, may be the same or different and each independently are $C_{1-10}$ alkyl; $R_{200}$ is hydrogen or $C_{1-6}$ alkyl, and $R_{300}$ and $R_{400}$ each may be the same or different and each independently hydrogen or $C_{1-18}$ alkyl, the alkyl being unsubstituted or substituted with at least one member selected from the group consisting of haloalkyl, $C_{1-4}$ alkoxyl, carboxyl, amino, hydroxyl, aryl, sulfonyl, alkoxycarbonyl, aminocarbonyl; and w is an integer from 1 to 10.

19. The composition of claim 18 wherein for a), $R_1$ is hydrogen and $R_2$ is $C_{6-20}$ aryl unsubstituted or substituted by one or more $C_{3-12}$ cycloalkyl, $C_{1-6}$ alkoxy, 2,3-epoxy propyl, hydroxyl, cyano, $C_{1-5}$ alkyl, or halogen groups; $R_{5a}$ is hydrogen; $R_{6a}$ is hydrogen; $R_3$ is hydrogen; $R_4$ is —(CH$_2$)$_n$—C(=O)—OR$_7$, where $R_7$ is hydrogen, and n is 0; $R_5$ is hydrogen; $R_6$ is X where X is —C(=O)—$R_{10}$ where $R_{10}$ is —O—$R_{11}$—O—C(=O)—C($R_{12}$)=$CH_2$, $R_{11}$ is a $C_2$ alkylene, $R_{12}$ is hydrogen; e and t are each not zero, and z is zero.

20. The composition of claim 18 wherein for a), $R_1$ is hydrogen and $R_2$ is $C_{6-20}$ aryl unsubstituted or substituted by one or more $C_{3-12}$ cycloalkyl, $C_{1-6}$ alkoxy, 2,3-epoxy propyl, hydroxyl, cyano, $C_{1-5}$ alkyl, or halogen groups; $R_{5a}$ is hydrogen; $R_{6a}$ is hydrogen; $R_3$ is hydrogen; $R_4$ is —(CH$_2$)$_n$—C(=O)—OR$_7$, where $R_7$ is hydrogen, and n is 0; $R_5$ is hydrogen; $R_6$ is X where X is —C(=O)—$R_{10}$ where $R_{10}$ is —O—$R_{11}$—O—C)=O)—C($R_{12}$)=$CH_2$, $R_{11}$ is a $C_2$ alkylene, $R_{12}$ is hydrogen; each of e, t and z are not zero; and $R_{40}$ is

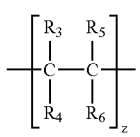

where $R_3$ in [ ]$_z$ and $R_5$ in [ ]$_z$ are hydrogen, $R_4$ in [ ]$_z$ is —(CH$_2$)$_n$—C(=O)—OR$_7$, where $R_7$ is hydrogen, n is 0; $R_6$ in $[\ ]_z$ is —$(CH_2)_n$—$C(=O)$—$OR_7$, where $R_7$ is $C_{1-50}$ alkyl substituted by $C_{1-6}$ alkoxy, and n is 0.

21. The composition of claim 18 wherein for a), $R_1$ is hydrogen and $R_2$ is $C_{6-20}$ aryl unsubstituted or substituted by one or more $C_{3-12}$ cycloalkyl, $C_{1-6}$ alkoxy, 2,3-epoxy propyl, hydroxyl, cyano, $C_{1-5}$ alkyl, or halogen groups; $R_{5a}$ is hydrogen; $R_{6a}$ is hydrogen; $R_3$ is hydrogen; $R_4$ is —$(CH_2)_n$—$C(=O)$—$OR_7$, where $R_7$ is hydrogen, and n is 0; $R_5$ is hydrogen; $R_6$ is X where X is —$C(=O)$—$R_{10}$ where $R_{10}$ is —O—$R_{11}$—O—$C(=O)$—$C(R_{12})=CH_2$, $R_{11}$ is a $C_2$ alkylene, $R_{12}$ is hydrogen; and each of e, t and z are each zero.

22. A process for forming a pattern on a substrate comprising:

1) providing on a substrate a layer of a composition comprising:

a) a photopolymerizable compound having the formula

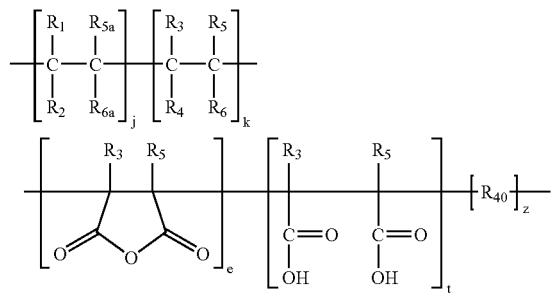

where $R_1$ is hydrogen and $R_2$ is $C_{6-20}$ aryl unsubstituted or substituted by one or more $C_{3-12}$ cycloalkyl, $C_{1-6}$ alkoxy, 2,3-epoxy propyl, hydroxyl, cyano, $C_{1-5}$ alkyl, or halogen groups; $R_{5a}$ is hydrogen; $R_{6a}$ is hydrogen; $R_3$ is hydrogen; $R_4$ is —$(CH_2)_n$—$C(=O)$—$OR_7$, where $R_7$ is hydrogen, and n is 0; $R_5$ is hydrogen; $R_6$ is X where X is —$C(=O)$—$R_{10}$ where $R_{10}$ is —O—$R_{11}$—O—$C(=O)$—$C(R_{12})=CH_2$, $R_{11}$ is a $C_2$ alkylene, $R_{12}$ is hydrogen: j, k, e, t, and z are each whole numbers such that the sum of j, k, e, t, and z ranges from about 2 to about 20, with and k each being equal to or greater than 1, and each of e, t and z are each zero;

b) at least one ethylenically unsaturated photopolymerizable polyalkylene oxide hydrophilic monomer;

c) at least one nonionic surfactant; and d) at least one photoinitiator;

2) imagewise exposing the layer of resist composition to irradiation;

3) developing the resist to form the desired pattern of vias;

4) depositing esoterically conductive material in the vias to form a desired pattern of electrical interconnections; and 5) removing the resist.

23. The process of claim 22 wherein the composition further comprises at least one amine modified acrylic oligomer.

* * * * *